United States Patent [19]
Nikawa

[11] Patent Number: 6,028,435
[45] Date of Patent: Feb. 22, 2000

[54] SEMICONDUCTOR DEVICE EVALUATION SYSTEM USING OPTICAL FIBER

[75] Inventor: Kiyoshi Nikawa, Tokyo, Japan

[73] Assignee: NEC Corporation, Tokyo, Japan

[21] Appl. No.: 08/821,518

[22] Filed: Mar. 21, 1997

[30]      Foreign Application Priority Data

Mar. 22, 1996  [JP]  Japan ................................. 8-093341

[51] Int. Cl.$^7$ ................................................. G01R 31/28
[52] U.S. Cl. .......................... 324/752; 324/501; 324/760; 324/753; 324/703
[58] Field of Search ..................... 324/752, 751, 324/753, 501, 719, 703, 73.1, 760

[56]           References Cited

U.S. PATENT DOCUMENTS

| 3,867,697 | 2/1975 | Vanzetti ................................. 324/752 |
| 5,631,571 | 5/1997 | Spaziani ................................. 324/752 |
| 5,804,980 | 9/1998 | Nikawa ................................. 324/752 |

FOREIGN PATENT DOCUMENTS

| 06300824 | 10/1994 | Japan . |
| 6-300824 | 10/1994 | Japan . |
| 07092237 | 4/1995 | Japan . |
| 07174808 | 7/1995 | Japan . |
| 076167924 | 7/1995 | Japan . |
| 8-160095 | 6/1996 | Japan . |

OTHER PUBLICATIONS

Japanese Office Action dated Mar. 31, 1998 with English language translation of Japanese Examiner's comments.

M. Sanada, "New Application of Laser Beam to Failure Analysis of LSI with Multi–Metal Layers", Microelectronics and Reliability, vol. 33, No. 7, pp. 993–1009, 1993.

M. Sanada, "Evaluation and Detection of CMOS–LSI with Abnormal IDDQ", Microelectronics and Reliability, vol. 35, No. 3, pp. 619–629, Jan. 1995.

T. Koyama et al., "Bias–free evaluation Technique for Al interconnects with sensitive OBIC", Proceedings of Japanese Applied Physics Society, 22a–7P–10, p. 586, Jan. 1994.

Primary Examiner—Josie Ballato
Assistant Examiner—Jose M. Solis
Attorney, Agent, or Firm—Whitham, Curtis & Whitham

[57]           ABSTRACT

In a system for evaluating a semiconductor device, a laser beam generating unit generates a laser beam, and an optical fiber receives the laser beam to heat an area of the semiconductor device. A current deviation detector or a voltage deviation detector is connected to a terminal of the semiconductor device. As a result, the current deviation detector or the voltage deviation detector detects a current deviation or a voltage deviation at the terminal of the semiconductor device.

51 Claims, 29 Drawing Sheets

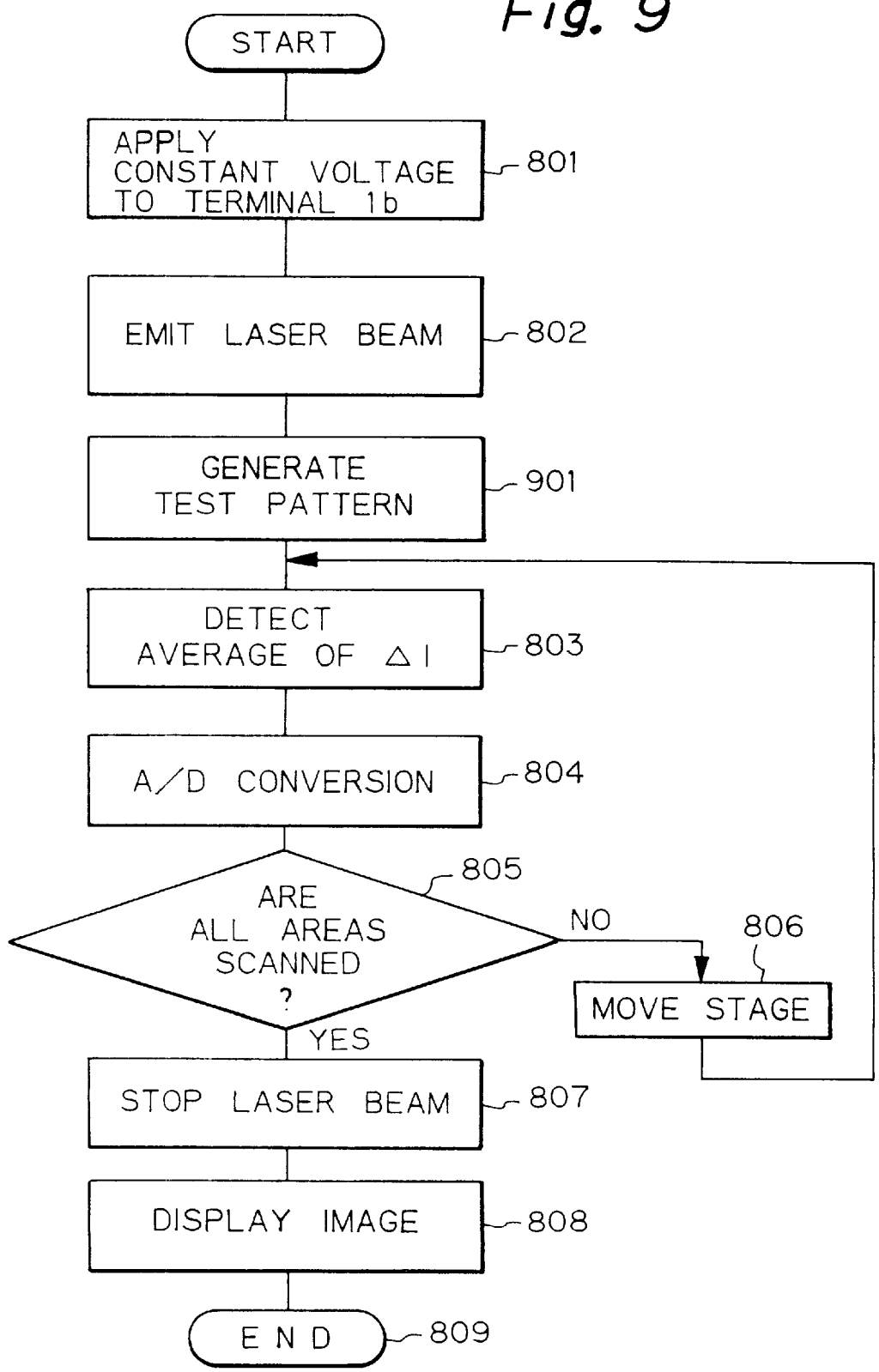

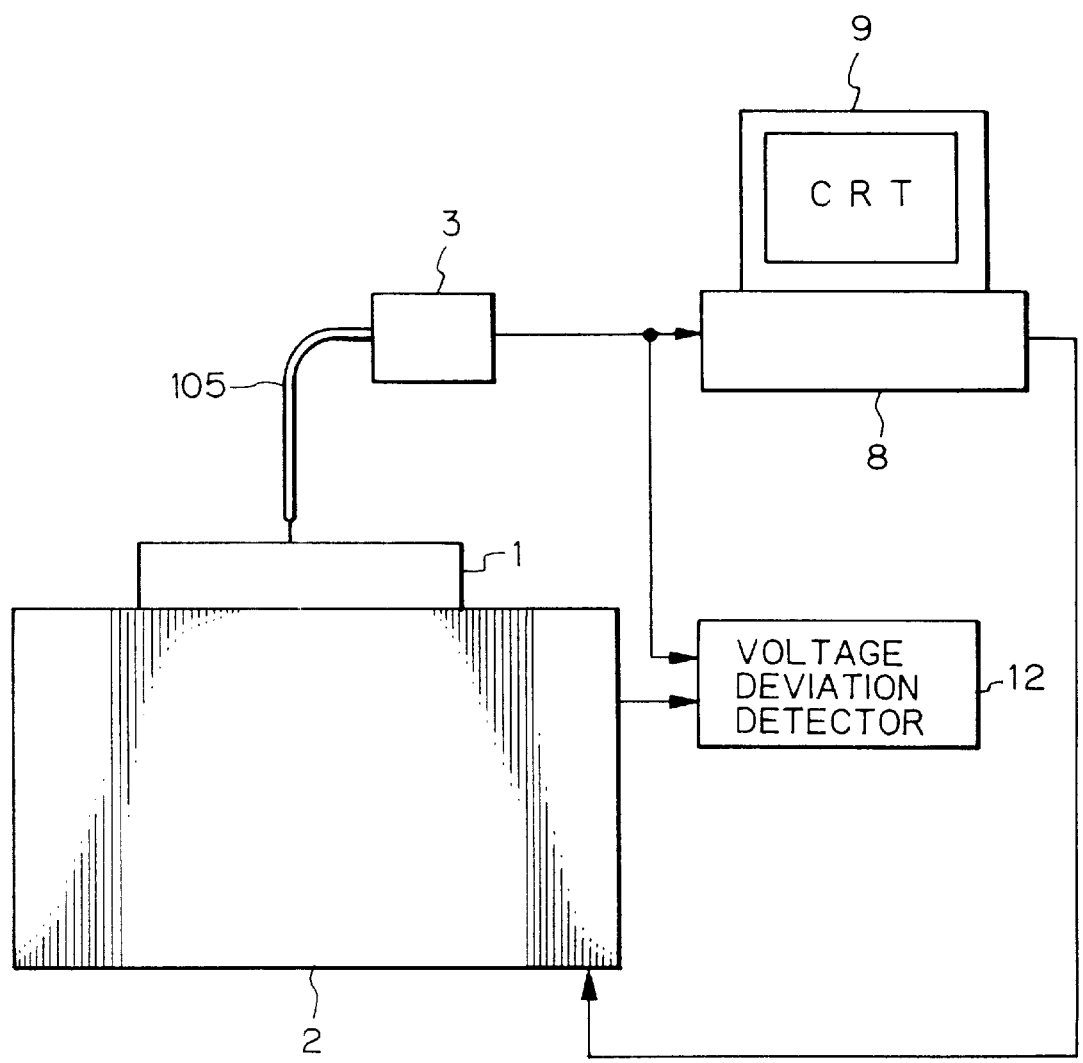

SEMICONDUCTOR DEVICE EVALUATION SYSTEM USING OPTICAL FIBER

BACKGROUND OF THE INVENTION

1. Field of the Invention

The present invention relates to a system for evaluating a semiconductor device.

2. Description of the Related Art

In a prior art system for evaluating a semiconductor device (see JP-A-6-300824), the semiconductor device is irradiated with a visible laser light beam, an electron beam or an ion beam, and thus, an irradiated area of the semiconductor device is heated. As a result, in increase of resistance is caused by the increase of temperature in the semiconductor device to create a current deviation therein. This is called a beam induced resistance change (BIRCH) method. Specifically, an optical beam induced resistance change (OBIRCH) method, an electron beam induced resistance change (EBIRCH) method and an ion beam induced resistance change (IBIRCH) method are named after the BIRCH method, and use a laser beam, an electron beam and an ion beam, respectively. Thus, voids in a interconnect layer such as an aluminum layer and precipitates of silicon can be detected by detecting the above-mentioned current deviation. Also, a current flowing through an interconnect layer of the semiconductor device can be monitored by the above-mentioned current deviation. Thus will be explained later in detail.

In the above-described prior art system, a constant voltage, i.e., a bias voltage is usually applied to the semiconductor device; however, a bias-free or non-bias OBIRCH method (NB-OBIC method) is known (see T. Koyama et al, "Bias-free evaluation technique for Al interconnects with high sensitive OBIC", Proceedings of Japanese Applied Physics Society, 22a-ZP-10, p.586, 1994). In the NB OBIC method, if a fault exists in an interconnect layer, the conduction state of heat is different in the proximity of the fault, so that a temperature gradient is generated in the proximity of the fault, thus generating an electromotive force therein, which can be detected as a current.

In the above-described prior art system, however, if the semiconductor device is irradiated with a laser beam or an electron beam, electron-hole pairs are generated in a semiconductor substrate of the semiconductor device, so that such electron-hole pairs also generate a current therein. This is called an optical beam induced current (OBIC) phenomenon and an electron beam induced current (EBIC) phenomenon for the laser beam and the electron beam, respectively.

For example, in the OBIC phenomenon, an OBIC signal overlaps with an OBIRCH signal (or an NB-OBIC signal). Note that, usually, the OBIC signal is larger than the OBIRCH signal (or the NB-OBIC signal), and in addition, the dynamic range of the system is too small to amplify both of the OBIC signal and the OBIRCH signal (or the NB-OBIC signal). Therefore, the OBIRCH signal (or the NB-OBIC signal) cannot be observed, since the OBIC signal is too strong.

Similarly, in the EBIC phenomenon, an EBIC signal overlaps with an EBIRCH signal (or an NB-EBIC signal). Note that, usually, the EBIC signal is stronger than the EBIRCH signal (or the NB-EBIC signal), and in addition, a dynamic range of the system is too small to amplify both of the EBIC signal and the EBIRCH signal (or the NB-EBIC signal). Therefore, the EBRCH signal (or the NB-EBIC signal) cannot be observed, since the EBIC signal is too strong.

In a test element group (TEG) where test elements are formed in a semiconductor chip for the evaluation of circuit characteristics and manufacturing process characteristics to establish a new manufacturing process or modify a manufacturing process, connections for the test elements can be designed to suppress the OBIC signal or the EBIC signal. However, actual semiconductor products cannot be designed to suppress the OBIC signal or the EBIC signal.

On the other hand, if a semiconductor device is irradiated with an ion beam, an irradiated area of the semiconductor device is sputtered by the ion beam, so that it is impossible to evaluate the semiconductor device non-destructively.

SUMMARY OF THE INVENTION

It is an object of the present invention to provide a semiconductor device evaluation system which can suppress generation of electron-hole pairs and can carry out a non-destructive evaluation.

Another object is to provide a method for evaluating a semiconductor device which also suppress generation of electron hole pairs and can carry out a non-destructive evaluation.

According to the present invention, in a system for evaluating a semiconductor device, a laser beam generating unit generates a laser beam, and an optical fiber receives the laser beam to heat an area of the semiconductor device. A current deviation detector or a voltage deviation detector is connected to a terminal of the semiconductor device. As a result, the current deviation detector or the voltage deviation detector detects a current deviation or a voltage deviation at the terminal of the semiconductor device.

Since the semiconductor device is locally heated by the tip portion of the optical fiber, electron-hole pairs are hardly generated within a semiconductor substrate of the semiconductor device. Also, since use is made of laser and/or thermal radiation/conduction via a tip portion of an optical fiber, not ion beams, the evaluation of the semiconductor device can be non-destructively carried out.

BRIEF DESCRIPTION OF THE DRAWINGS

The present invention will be more clearly understood from the description as set forth below, as compared with the prior art and earlier suggested art, with reference to the accompanying drawings, wherein:

FIGS. 6, 7, 8, 9, 10A, 10B and 11 are flowcharts for showing the operation of the system control and signal processing unit of FIG. 4;

FIG. 24 is a diagram illustrating a fourth embodiment of the semiconductor device evaluation system according to the present invention;

DESCRIPTION OF THE PREFERRED EMBODIMENTS

Before the description of the preferred embodiments, a prior art semiconductor device evaluation system will be explained with reference to FIGS. 1 and 2.

Figure 1:
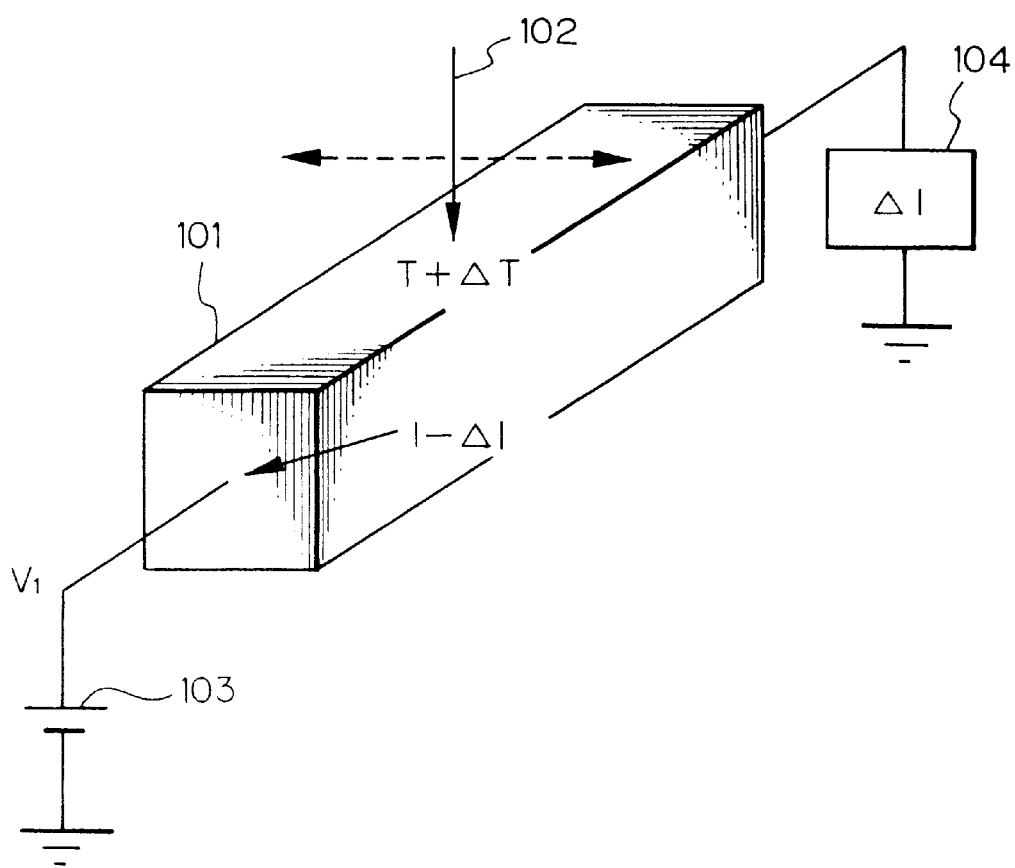
FIG. 1 is a perspective view for explaining a principle of an earlier suggested semiconductor device evaluation system.

In FIG. 1, which illustrates a principle of an earlier suggested semiconductor device evaluation system (see Japanese Patent Application No.6-230672 filed on Aug. 31, 1994 and published on Jun. 21, 1996 as JP-A-8-160095), an interconnect layer 101 of a semiconductor device is irradiated with a beam 102 such as a visible laser beam, an electron beam or an ion beam, so that the interconnect layer 101 is heated. As a result, the temperature of the interconnect layer 101 is increased from T to T+ΔT. Therefore, the resistance of the interconnect layer 101 is increased from R to R+ΔR. In this case, since a constant voltage $V_1$ is applied by a constant voltage source 103 to the interconnect layer 101, a current flowing through the interconnect layer 101 is decreased from I to I−ΔI. In this case, $$\Delta I \approx -(\Delta R/R)I \qquad (1)$$

where R is a resistance of the interconnect layer 101 with no beam irradiation; and I is a current flowing through the interconnect layer 101 with no beam irradiation. The current deviation ΔI is detected by a current deviation detection circuit 104.

If the irradiated area of the interconnect layer 101 includes voids, silicon precipitates or other defects, the temperature deviation ΔT is further increased, and therefore, the resistance deviation ΔR is further increased. Therefore, the current deviation ΔI is also increased. Thus, the defects at the interconnect layer 101 can be detected in accordance with the current deviation ΔI corresponding to ΔR.

Similarly, if a constant current source instead of the constant voltage source 103 is connected to the interconnect layer 101, the formula (1) is replaced by $$\Delta V = \Delta R \cdot I \qquad (2)$$

In this case, the semiconductor device can be evaluated by detecting the voltage deviation ΔV corresponding to ΔR.

Note that the evaluation of the semiconductor device by the resistance deviation ΔR is disclosed in JP-A-6-300824. An image of the semiconductor device obtained by ΔR is called a defect image.

Further, the absolute value of the current I is represented by $$I \approx -R \cdot \Delta I / \Delta R \qquad (3)$$

Therefore, in order to obtain the absolute value of the current I, the resistance R and the resistance deviation ΔR in addition to the current deviation ΔI have to be determined; it is difficult to determine R and ΔR. However, if the interconnect layer has almost no defects, the current I can be observed, i.e., it is easy to determine whether the current I is normal or abnormal. Particularly, if the expected current is zero in a normal product, a path through which an abnormal current flows can be easily observed in a defective product. An image obtained by this abnormal current path is called a current image.

Figure 2:
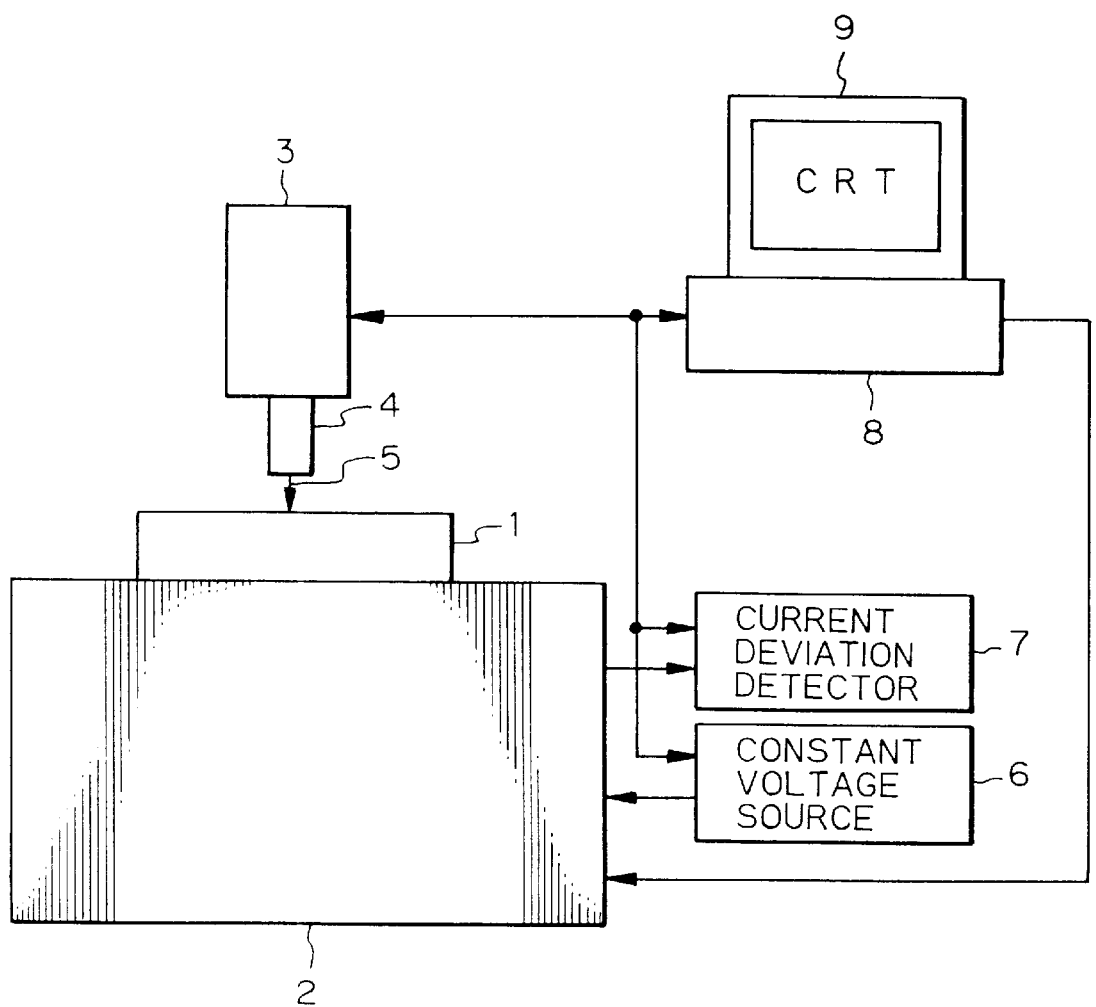
FIG. 2 is a diagram illustrating a prior art semiconductor device evaluation system.

In FIG. 2, which illustrates a prior art semiconductor device evaluation system (see JP-A-6-300824), a semiconductor device (chip) 1 is mounted on a stage 2. A laser beam generated from a visible laser beam generating unit 3 is incident to a microscope unit 4. The laser beam indicated by reference numeral 5 is focused on the semiconductor device 1. Also, a constant voltage source 6 and a current deviation detector 7 are connected via the stage 2 to corresponding pins of the semiconductor device 1.

The visible laser beam generating unit 3, the constant voltage source 6 and the current deviation detector 7 are connected to a system control and signal processing unit 8 which is a kind of computer and is connected to a display unit 9 such as a cathode ray tube (CRT). The display unit 9 can display a defect image and a current image. Also, the stage 2 is controlled by the system control signal processing unit 8, so that the stage 2, can move three-dimensionally.

Thus, an area of the semiconductor device 1 irradiated with the visible laser beam 5 is heated. An increase of resistance caused by the increase of temperature in the semiconductor device 1 creates a current deviation therein. This current deviation is detected by the current deviation detector 7. In this case, the system control and signal processing unit 8 operates the visible laser beam generating unit 3 so that the semiconductor device 1 is scanned with the visible laser beam 5. As a result, an obtained defect image, or current image is displayed on the display unit 9.

In FIG. 2, an electron beam or an ion beam can be used instead of the visible laser beam 5.

In the prior art system as illustrated in FIG. 2, as explained above, however, if the semiconductor device 1 is irradiated with the laser beam or the electron beam, electron-hole pairs are generated in a semiconductor substrate of the semiconductor device 1, so that such electron-hole pairs also generate a current therein.

On the other hand, if the semiconductor device 1 is irradiated with the ion beam, an irradiated area of the semiconductor device 1 is sputtered by the ion beam, so that it is impossible to non-destructively evaluate the semiconductor device 1.

Figure 3A:
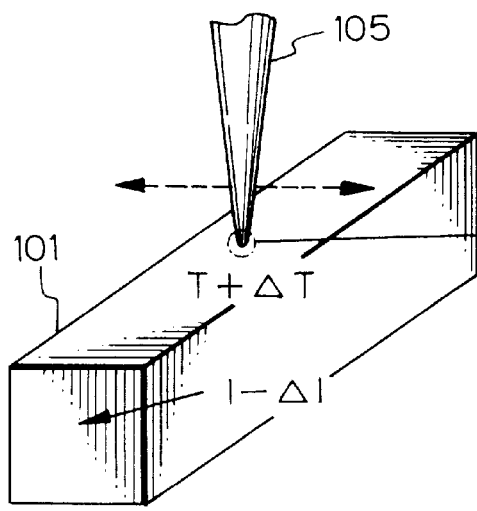
FIG. 3A is a perspective view for explaining a principle of a semiconductor device evaluation system according to the present invention.
Figure 3B:
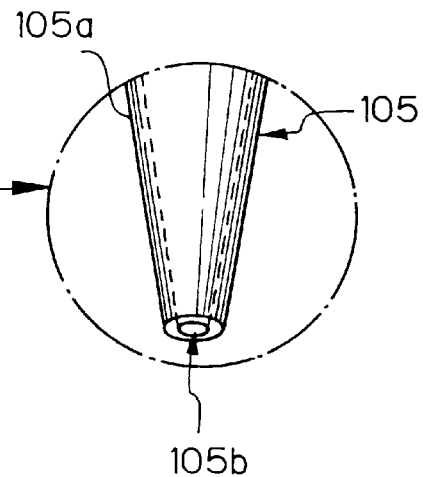
FIG. 3B is a partly enlarged diagram of FIG. 3A.

FIG. 3A is a perspective view illustrating a principle of a semiconductor device evaluation system according to the present invention, and FIG. 3B is a partly enlarged view of FIG. 3A. In FIGS. 3A and 3B, the interconnect layer 101 is irradiated with a laser beam emitted from an optical fiber 105. The optical fiber 105 is spire-shaped and is coated by a layer 105a made of aluminum or gold. In this case, the tip portion of the optical fiber 105 is exposed, in other words, the tip portion of the optical fiber 105 is not coated by the layer 105a. Thus, an aperture 105b is formed at the tip portion of the optical fiber 105.

The tip portion of the optical fiber 105 is very small. For example, the diameter of the tip portion is about 20 nm.

Therefore, the semiconductor device 1 can be locally heated. Thus, the sensitivity of detection of detects and the space resolution can be remarkably improved. Note that the diameter of the beam cross-section of the laser beam 102 of FIG. 1 using 633 nm He—Ne laser is about 0.4 μm.

The interconnect layer 101 is heated by the irradiation of the laser beam emitted into the optical fiber 105. The following four methods can be used for heating the interconnect layer 101:

(1) The heat within the tip portion of the optical fiber 105 is transferred by conduction of heat to the interconnect layer 101. In this case, the optical fiber 105 is in contact with the interconnect layer 101.

(2) The heat within the tip portion of the optical fiber 105 is transferred by thermal radiation to the interconnect layer 101. In this case, the optical fiber 105 is not in contact with the interconnect layer 101.

(3) The optical fiber 105 leaks near-field light through the aperture 105*b* smaller than the wavelength of the laser beam toward a small area of the interconnect layer 101, so as to heat the interconnect layer 101. In this case, the optical fiber 105 is not in contact with the interconnect layer 101, but is in very close proximity to the interconnect layer 101.

(4) The optical fiber 105 leaks far-field light through the aperture 105*b* larger than the wavelength of the laser beam toward a relatively large area of the interconnect layer 101, so as to heat the large area of the interconnect layer 101. In this case, when applied to actual semiconductor device, the laser beam should be a near infrared radiation. Also, the optical fiber 105 is not in contact with the interconnect layer 101.

Figure 3C:
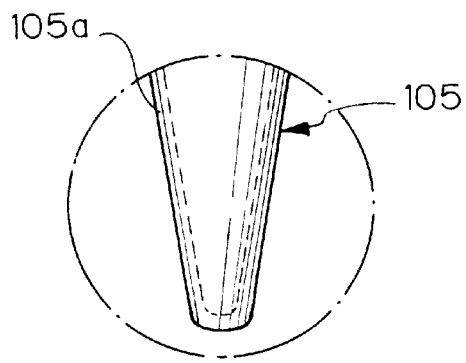
FIG. 3C is a diagram illustrating a modification of FIG. 3B.

Note that the tip portion of the optical fiber 105 can be completely coated by the layer 105*a* for the above-described heating methods (1) and (2) as illustrated in FIG. 3C.

Also, when the optical fiber 105 is not in contact with the semiconductor device 1, the above-mentioned heating methods (2), (3) and (4) may be effective. However, when the optical fiber 105 is too far apart from the semiconductor device 1, the heating method (3) is not effective because the near field light strength decreases rapidly as a function of distance from the source.

Further, in the heating method (4), when the wavelength of the laser beam is too short, the OBIC signal becomes strong to hinder the OBIRCH signal. In order to suppress the OBIC signal, the energy E of the laser beam needs to be smaller than a band gap energy $E_g$ (=1.12 eV) of silicon. Precisely, $$E < E_g - (E_1 + E_2)$$

where $E_1$ is a difference between a conduction band energy $E_c$ and a donor energy; and $E_2$ is a difference between a valence band energy $E_v$ and an accepter energy. For example, $E_1$ is 0.0044 eV for P and 0.049 eV for As, and $E_2$ is 0.045 eV for B. Thus, $$E < 1.12 \text{ eV} - (0.049 \text{ eV} + 0.045 \text{ eV}) = 1.026 \text{ eV } (=1.208 \text{ μm})$$

On the other hand, when the wavelength of the laser beam is too long, the laser beam cannot be converged well to reduce the sensitivity for detecting defects and the special resolution. In view of the foregoing, the laser beam uses a near infrared radiation having a wavelength of 1.3 μm generated from a laser diode, for example.

Figure 4:
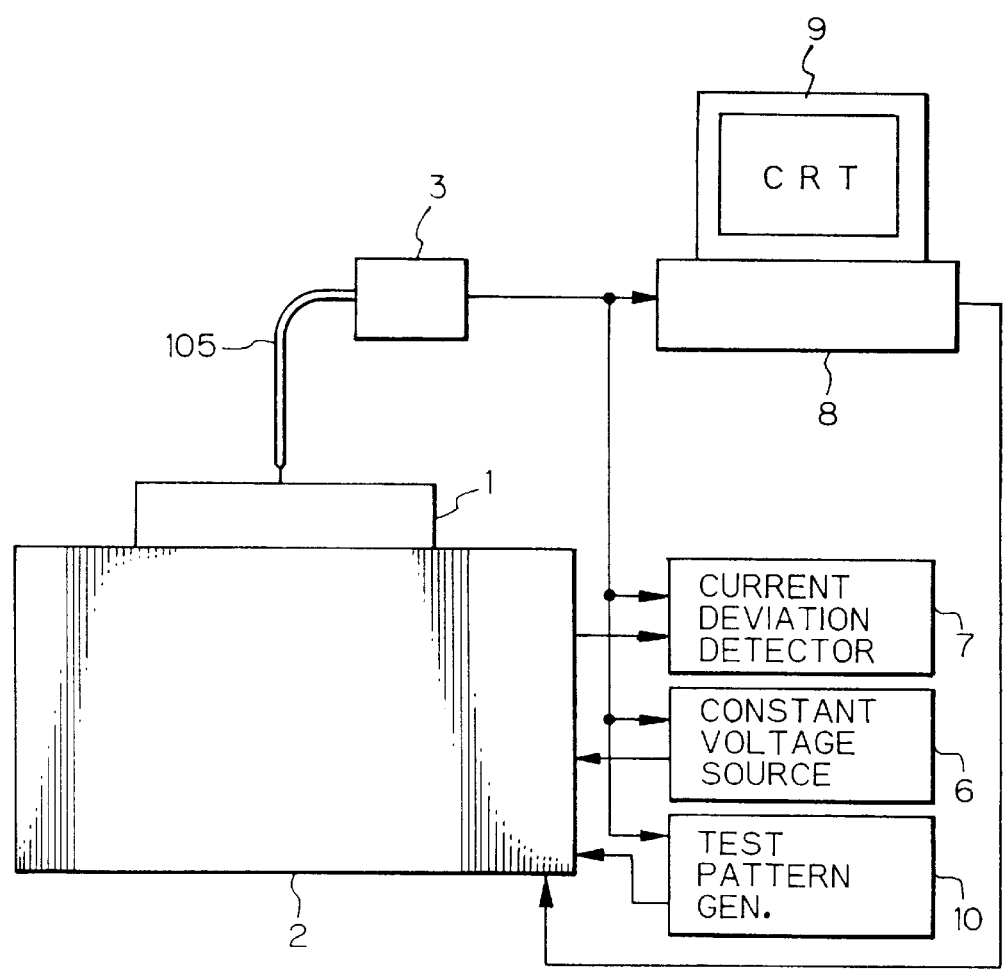
FIG. 4 is a diagram illustrating a first embodiment of the semiconductor device evaluation system according to the present invention.

In FIG. 4, which illustrates a first embodiment of the present invention, a test pattern generator 10 is provided for generating a test pattern to set the semiconductor device 1 in a specified state. Also, the optical fiber 105 of FIGS. 3A and 3B (or 3C) is provided instead of the microscope unit 4 of FIG. 2. In this case, when carrying out the heating method (1), the tip portion of the optical fiber 105 is in contact with the semiconductor device 1. Also, when carrying out the heating methods (2), (3) and (4), the tip portion of the optical fiber 105 is not in contact with the semiconductor device 1. Further, when carrying out the heating methods (1), (2) and (3), the laser beam emitted into the optical fiber 105 is visible radiation and when carrying out the heating method (4), the laser beam emitted into the optical fiber 105 is a near infrared radiation.

Figure 5:
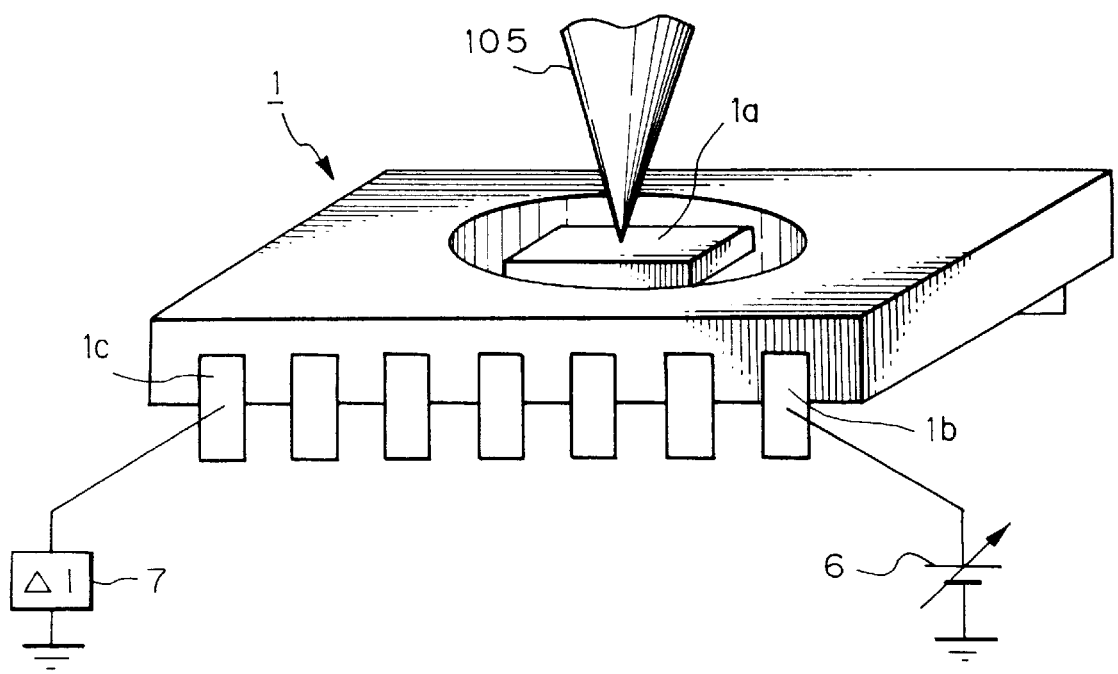
FIG. 5 is a partly enlarged diagram of the system of FIG. 4.

In FIG. 5, the semiconductor device 1 of FIG. 4 is enlarged. The semiconductor device 1 has a semiconductor chip 1*a* for receiving the laser beam or heat from the optical fiber 105. Also, a power supply terminal 1*b* of the semiconductor device 1 is connected to the constant voltage source 6. Further, a ground terminal 1*c* of the semiconductor device 1 is connected via the current deviation detector 7 to the ground. In this case, if an output terminal is open, all currents flowing through the semiconductor chip 1*a* flow into the ground terminal 1*c*, the current deviation detector 7 can operate effectively. However, the current deviation detector 7 can be connected to another terminal such as another power supply terminal or a signal terminal.

In FIG. 5, the current deviation ΔI (see the formula (1)) can be detected by the current deviation detector 7.

A first example of operation of the system control and signal processing unit 8 of FIG. 4 is explained next with reference to FIG. 6.

First, at step 601, the unit 8 operates the constant voltage source 6, so that a constant voltage is applied to the power supply terminal 1*b* of FIG. 5.

Next, at step 602, the unit 8 operates the laser beam generating unit 3, so that a laser beam is emitted into the optical fiber 105. As a result, an area of the semiconductor chip 1*a*, i.e., a interconnect layer thereof is heated, so that its resistance is increased.

Next, at step 603, the unit 8 operates the current deviation detector 7, so that the current deviation ΔI caused by the increase of resistance is detected.

Next, at step 604, the current deviation ΔI is displayed on the display unit 9.

Figure 6:
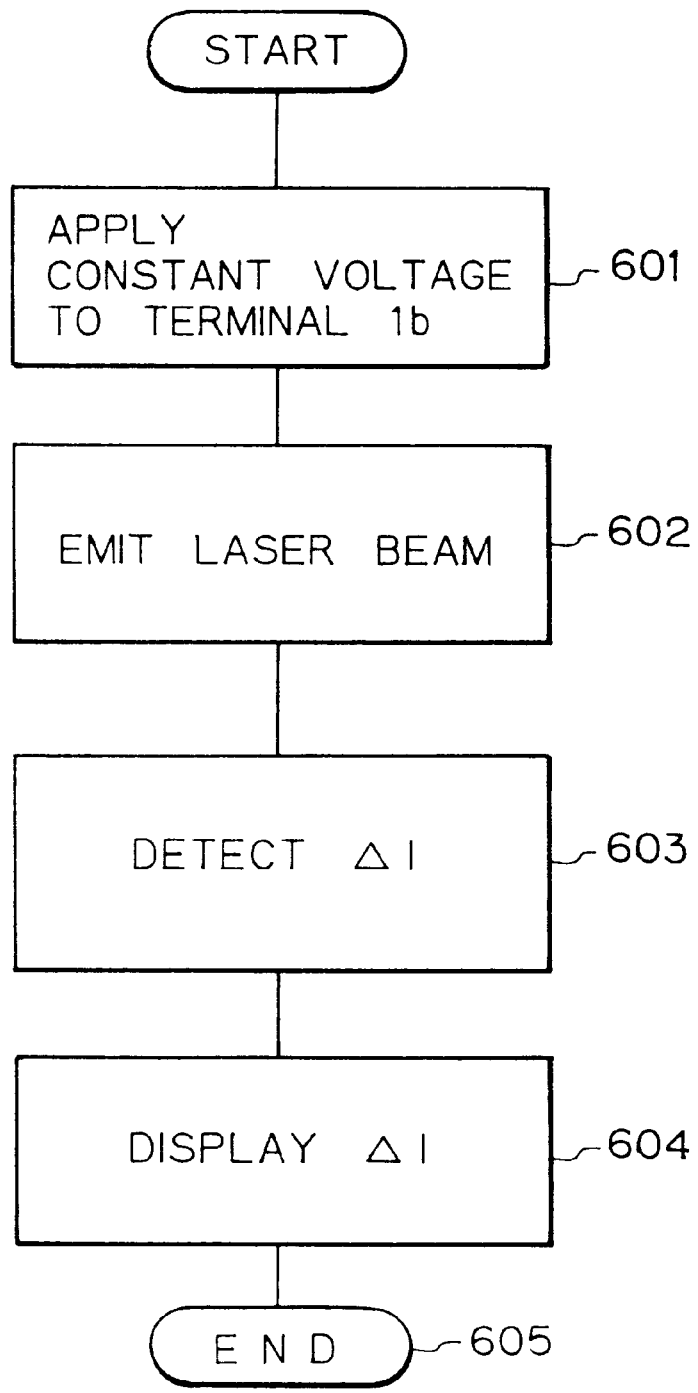

Finally, the routine of FIG. 6 is completed by step 605.

Figure 7:
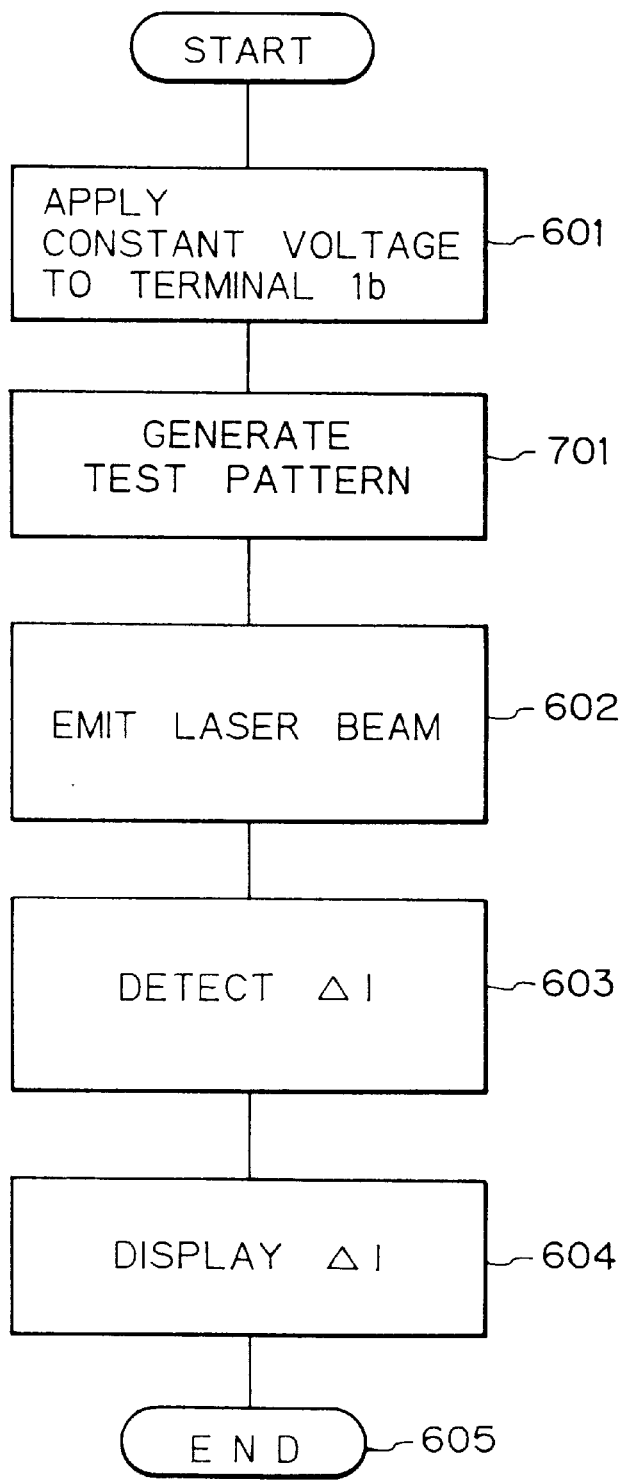

In FIG. 7, which is a modification of the flowchart of FIG. 6, a step 701 is added to the steps of FIG. 6. That is, at step 701, the unit 8 operates the test pattern generator 10, so that signals of a test pattern are supplied to terminals other than the terminals 1*b* and 1*c*. As a result, at step 604, the current deviation ΔI corresponding to a special state defined by the test pattern can be detected by the current deviation detector 7.

A second example of operation of the system control and signal processing unit 8 of FIG. 4 is explained next with reference to FIG. 8.

First, at step 801, the unit 8 operates the constant voltage source 6, so that a constant voltage is applied to the power supply terminal 1*b* of FIG. 5.

Next, at step 802, the unit 8 operates the laser beam generating unit 3, so that a laser beam is emitted into the optical fiber 105. As a result, an area of the semiconductor chip 1*a*, i.e., a interconnect layer thereof is heated, so that its resistance is increased.

Next, at step 803, the unit 8 operates the current deviation detector 7, so that the current deviation ΔI caused by the increase of resistance is detected. In this case, the unit 8 calculates an average of the detected current deviation ΔI for a definite duration such as 2 μsec.

Next, at step 804, an analog/digital (A/D) converter of the unit 8 performs an A/D conversion upon the detected average current deviation ΔI, and stores an obtained digital value into a corresponding location of a memory of the unit 8.

Next, at step 805, it is determined whether or not all required areas of the semiconductor chip 1a have been scanned with the laser beam. As a result, if all the required areas have not been scanned, the control proceeds to step 806. Otherwise, the control proceeds to step 807.

At step 806, the unit 8 moves the stage 2, so that the laser beam is moved to the next point of the semiconductor chip 1a. Then, the control at steps 803, 804 and 805 is repeated.

At step 807, the unit 8 stops the operation of the laser beam generating unit 3.

Next, at step 808, the unit 8 displays the digital values stored in the memory on the display unit 9, thus obtaining a defect image or a current image.

Figure 8:
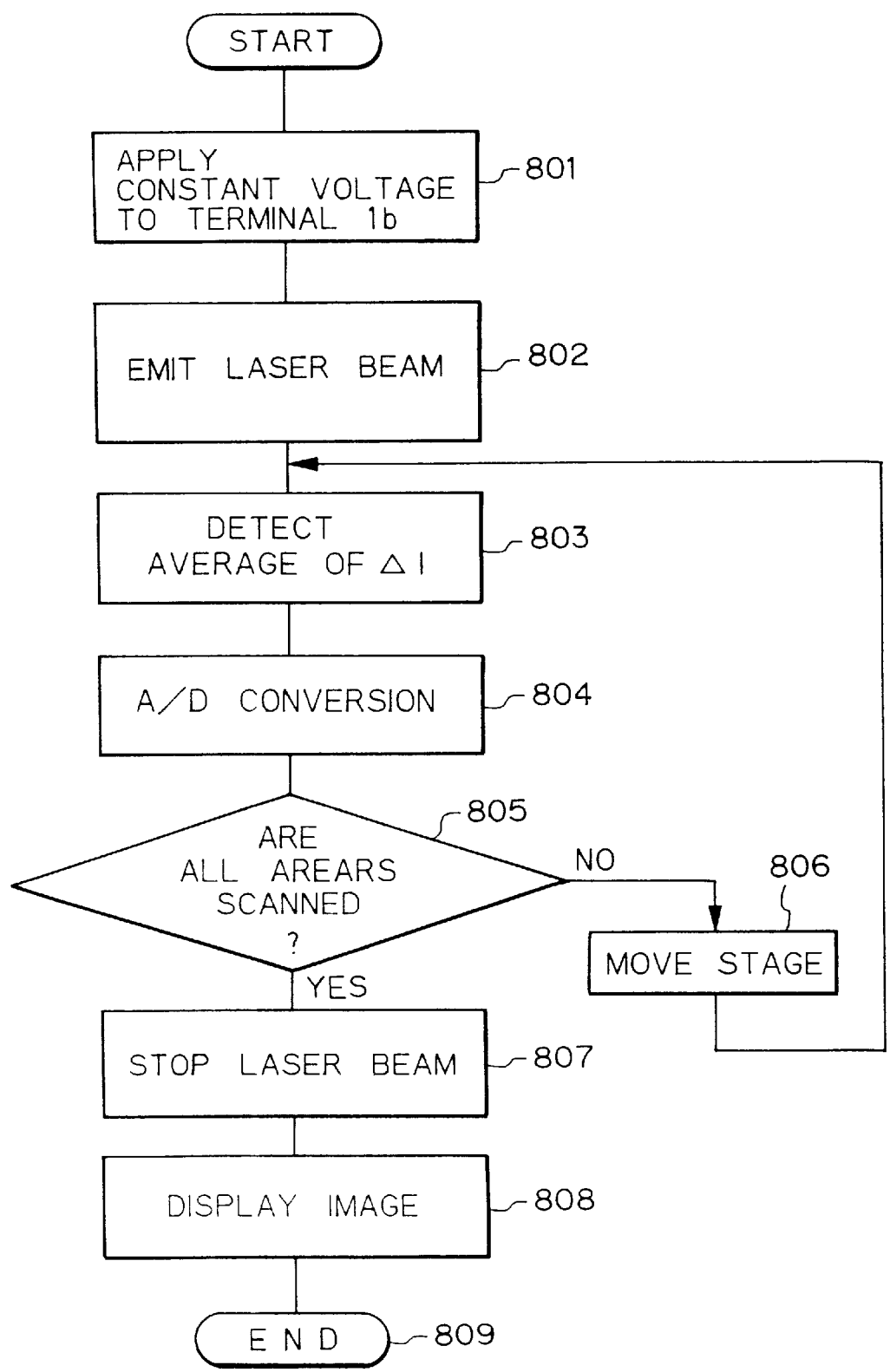

Finally, the routine of FIG. 8 is completed by step 809.

Note that, if the number of the scanning steps of the required area is 512×512, one defect image and/or current image can be obtained for every about 0.5 sec (=512×512×2 μsec).

In FIG. 9, which is a modification of the flowchart of FIG. 8, a step 901 is added to the steps of FIG. 8. That is, at step 901, the unit 8 operates the test pattern generator 10, so that signals of a test pattern are supplied to terminals other than the terminals 1b and 1c. As a result, at step 808, a defect image and/or current image corresponding to a special state defined by the test pattern can be displayed on the display unit 9.

A third example of operation of the system control and signal processing unit 8 of FIG. 4 is explained next with reference to FIG. 10A. For example, after a defect image or a current image is obtained by the flowchart of FIG. 8, if a current-to-time diagram of a specified area is required, the third example of operation is carried out.

First, at step 1001, the unit 8 operates the constant voltage source 6, so that a constant voltage is applied to the power supply terminal 1b of FIG. 5.

Next, at step 1002, the unit 8 operates the laser beam generating unit 3, so that a laser beam is emitted into the optical fiber 105. In this case, the laser beam is pulse-shaped, that is, is formed by pulses having a duration of 2 μsec and a duration of 1 μsec. As a result, a point of an area of the semiconductor chip 1a, i.e., a interconnect layer thereof is heated, so that its resistance is increased.

Next, at step 1003, the unit 8 operates the current deviation detector 7, so that the current deviation ΔI caused by the increase of resistance is detected. In this case, the unit 8 calculates an average of the detected current deviation ΔI for a definite duration such as the pulse duration of 1 μsec. Note that if a sufficient signal/noise (S/N) ratio cannot be obtained by one series of steps 1003 to 1005 and the detected current deviation ΔI has a period, the control at steps 1003 through 1005 is synchronized with the period of the detected current deviation ΔI so that the detected current deviations ΔI are calculated and averaged, the S/N ratio can be improved, as shown in FIG. 10B.

Next, at step 1004, an A/D converter of the unit 8 performs an A/D conversion upon the detected average current deviation ΔI, and stores an obtained digital value into a corresponding location of the memory of the unit 8.

Next, at step 1005, it is determined whether or not a predetermined duration has passed. As a result, when the predetermined duration has not passed yet, the control returns to step 1003. Otherwise, the control proceeds to step 1006.

At step 1006, the unit 8 stops the operation of the laser beam generating unit 3.

Next, at step 1007, the unit 8 displays the digital values stored in the memory on the display unit 9 so that the X axis shows time and the Y axis shows ΔI (proportional to I), thus obtaining a current to time diagram (current waveform).

Figure 10A:
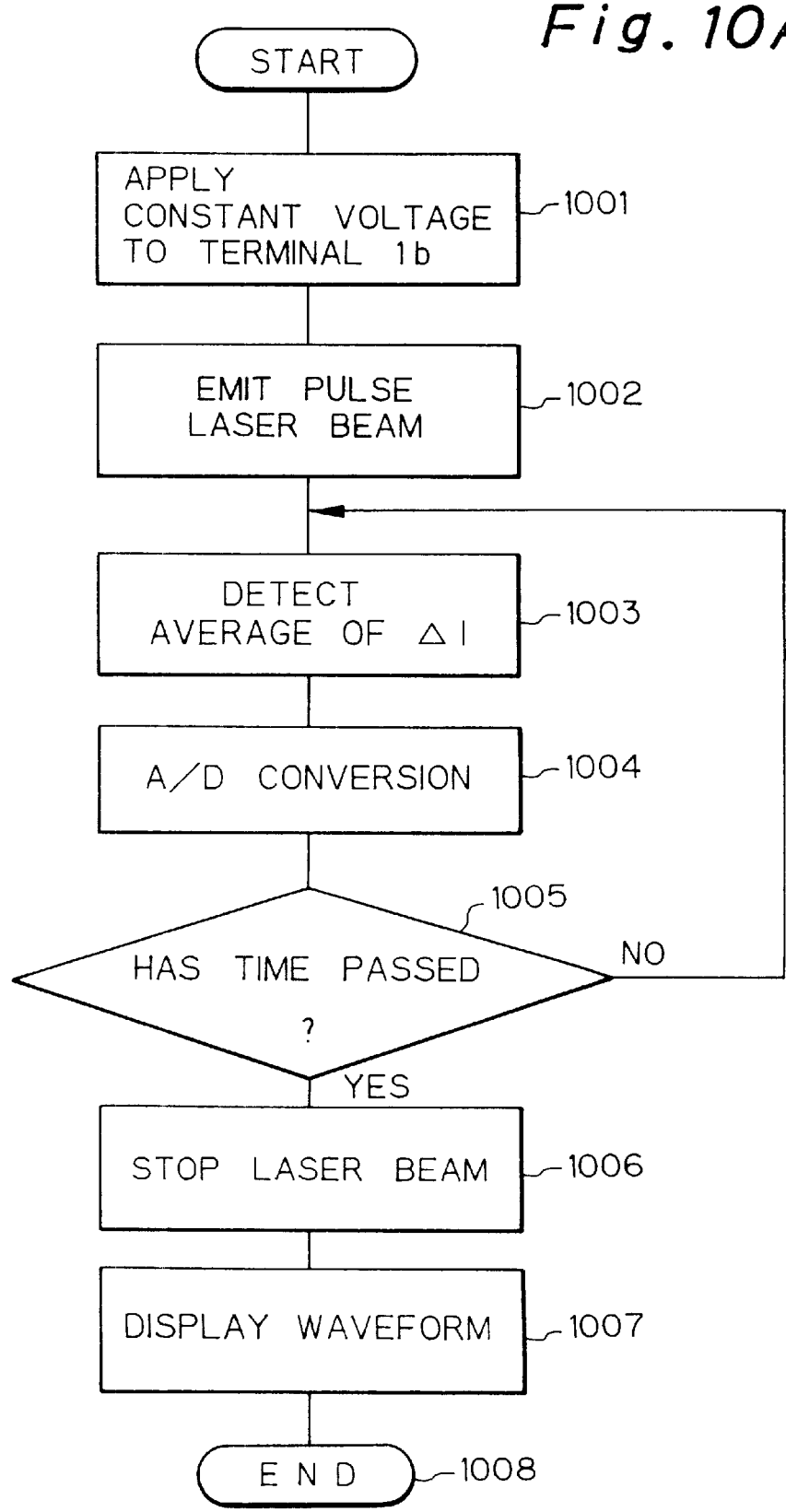
Figure 10B:
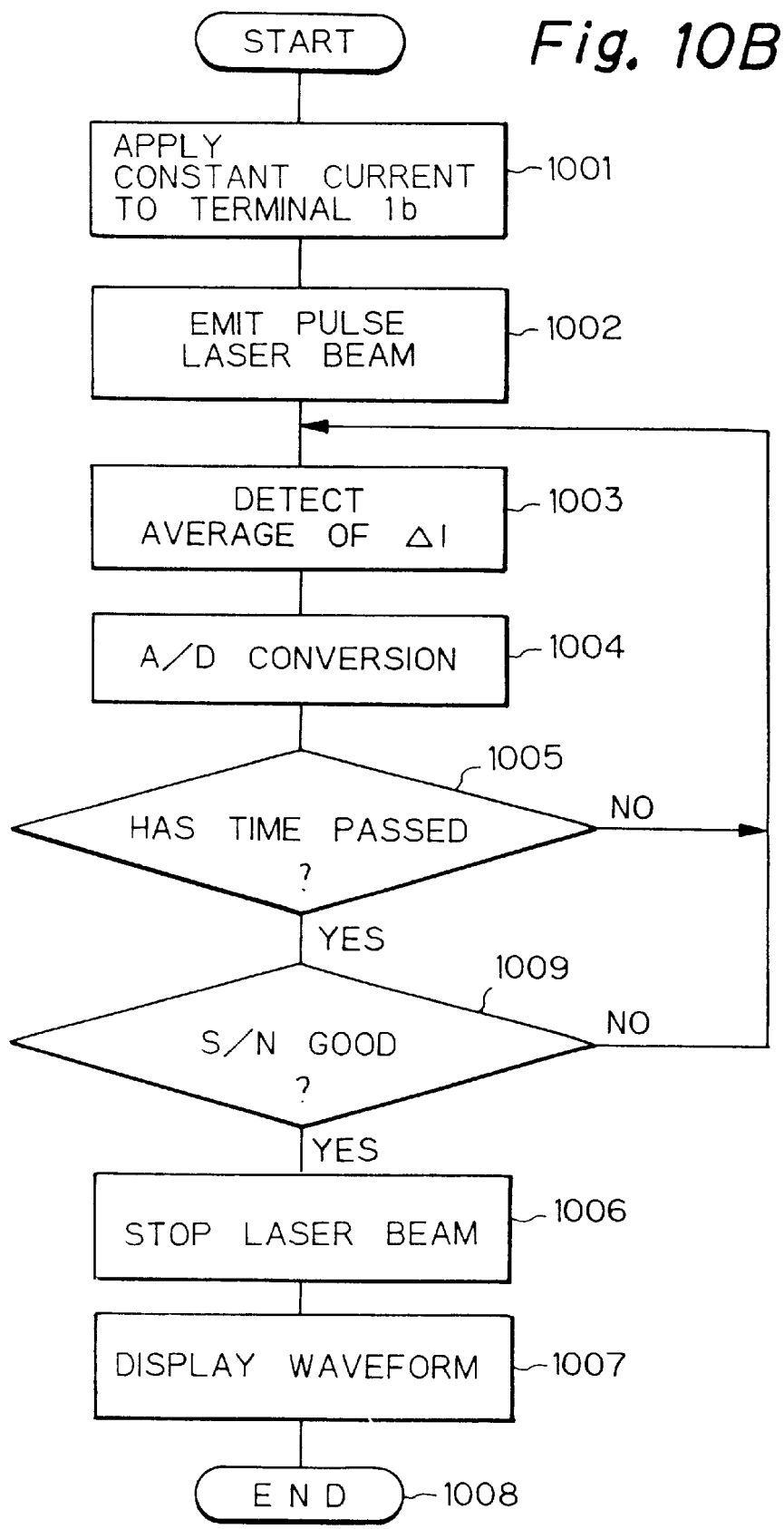

Finally, the routine of FIG. 10A is completed by step 1008.

Figure 11:
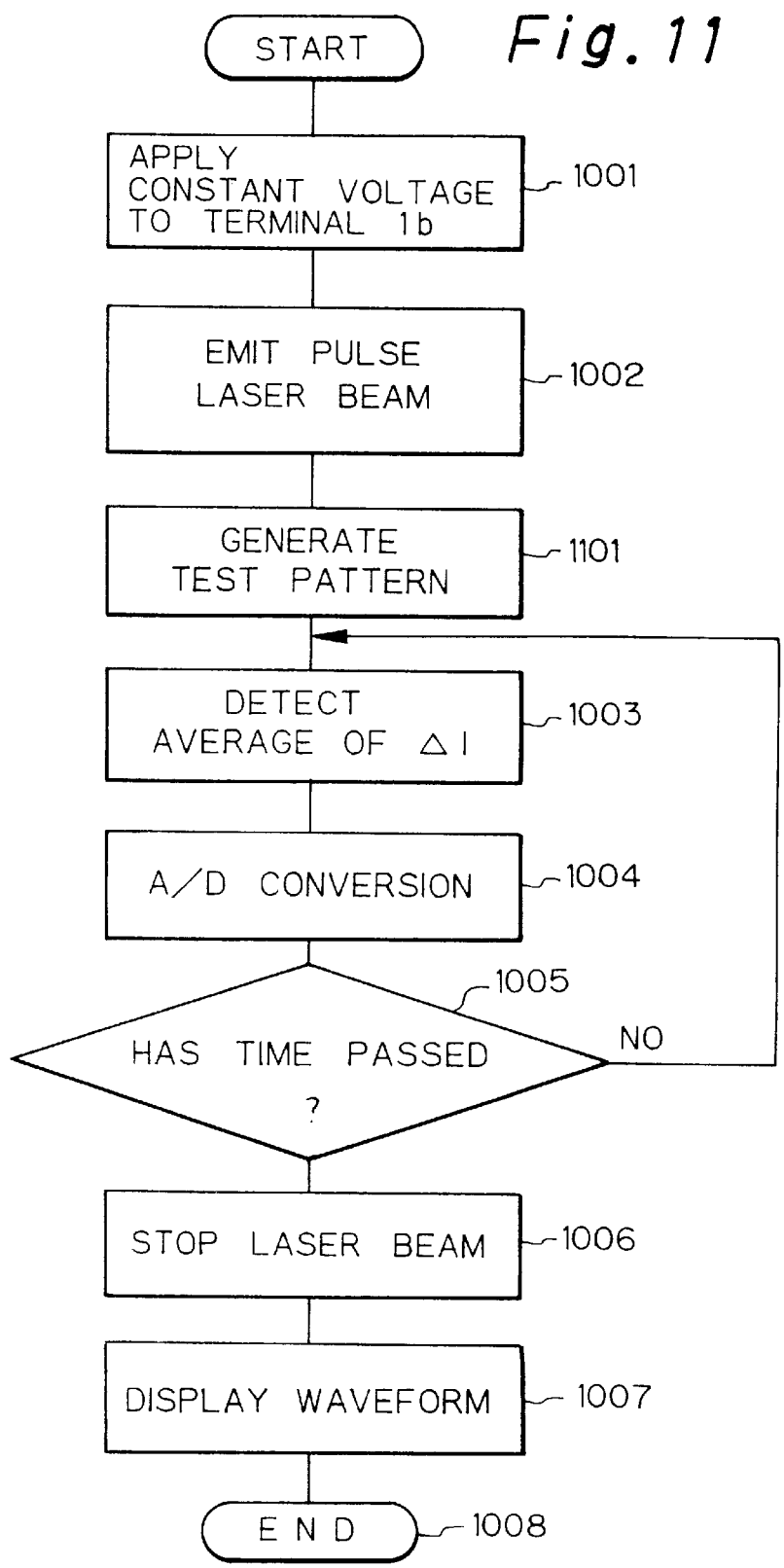

In FIG. 11, which is a modification of the flowchart of FIG. 10A, a step 1101 is added to the steps of FIG. 10A. That is, at step 1101, the unit 8 operates the test pattern generator 10, so that signals of a test pattern are supplied to terminals other than the terminals 1b and 1c. As a result, at step 1007, a current-to-time diagram corresponding to special states defined by the test pattern can be displayed on the display unit 9.

At step 1002 of FIGS. 10A and 11, if the pulse duration and duration of the laser beam is further reduced, a high time resolution can be obtained.

Figure 12:
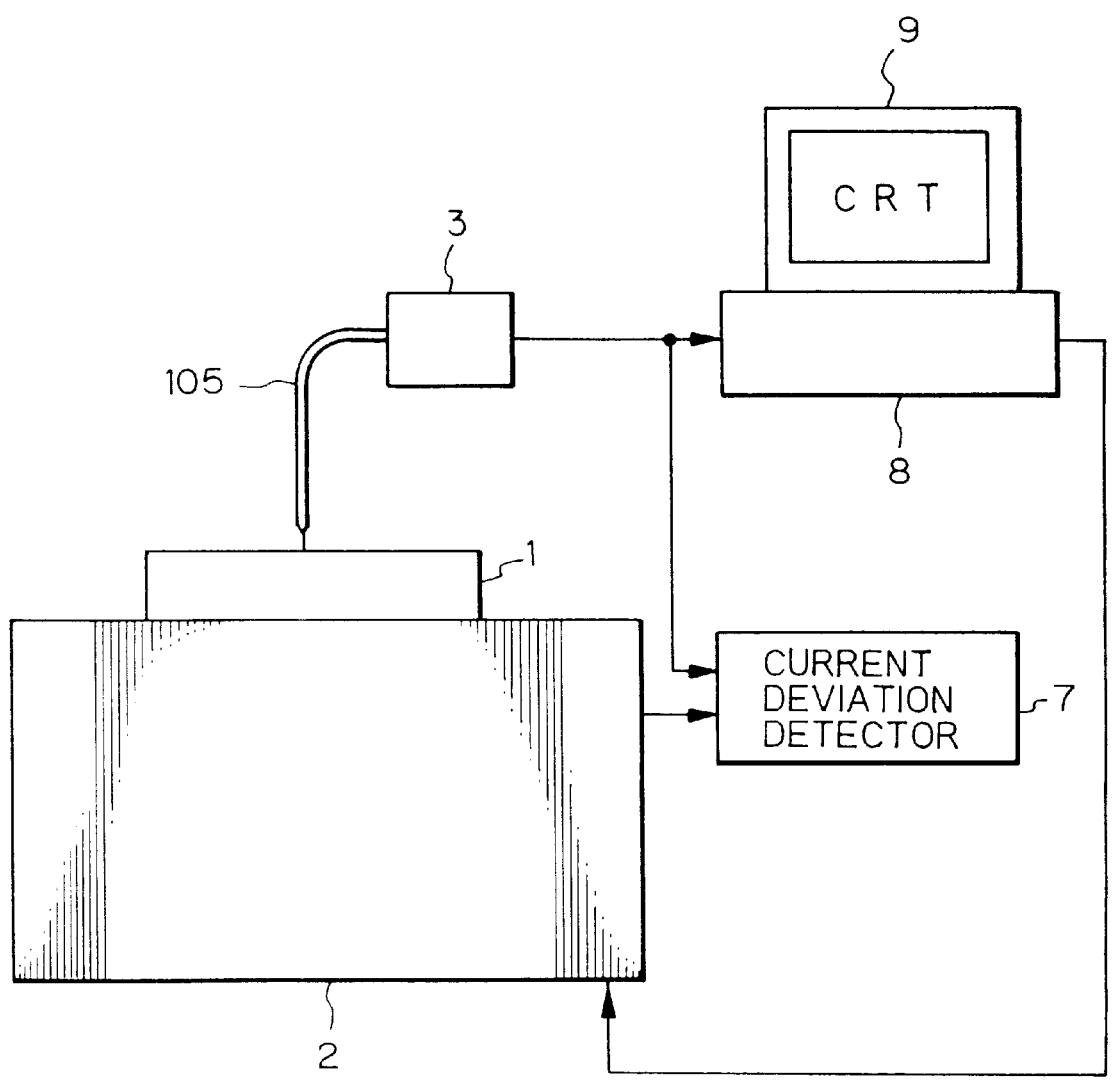
FIG. 12 is a diagram illustrating a second embodiment of the semiconductor device evaluation system according to the present invention.
Figure 13A:
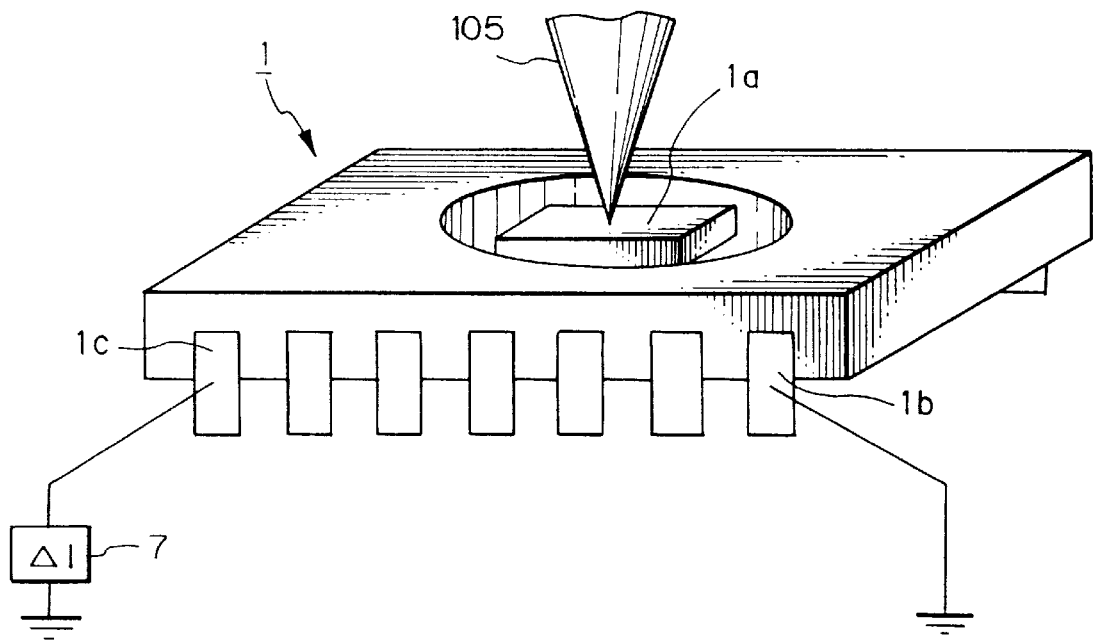
FIGS. 13A and 13B are partly enlarged disgrams of the system of FIG. 12.
Figure 13B:
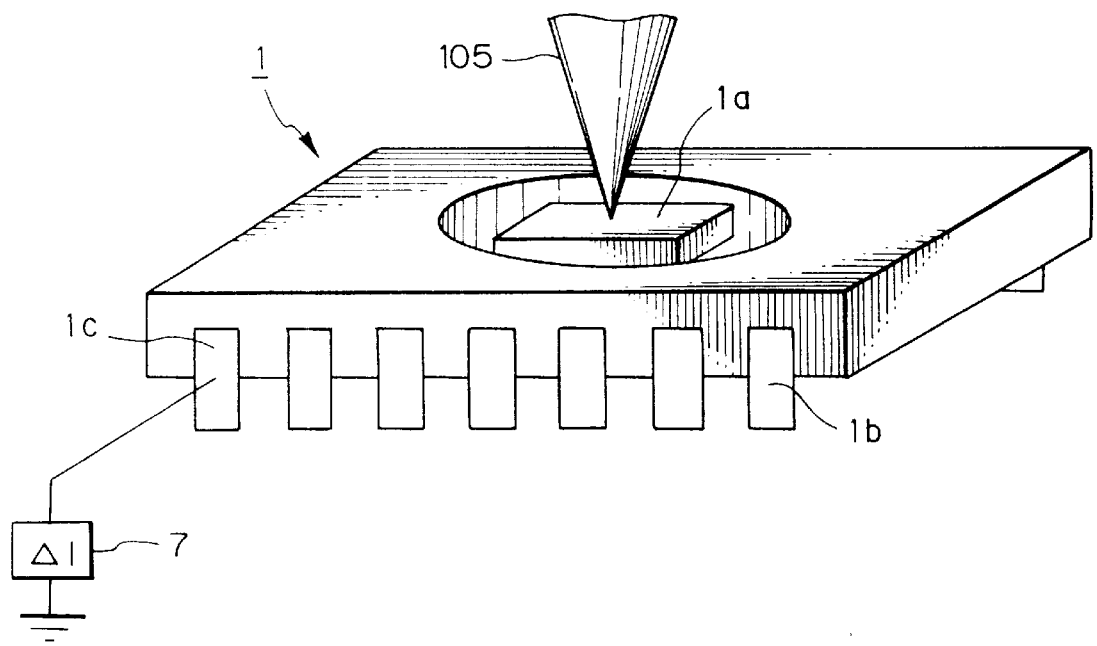

In FIG. 12, which illustrates a second embodiment of the present invention, the constant voltage source 6 and the test pattern generator 10 of FIG. 4 are not provided. In this case, as illustrated in FIG. 13A the power supply terminal 1b is grounded, so that an OBIRCH-NBI method, where the bias voltage is zero, is carried out, Or, as illustrated in FIG. 13B, the power supply terminal 1b is opened, so that an OBIRCH-NBI method, where no bias voltage is applied, is carried out. In these methods, as stated above, if a fault exists in a interconnect layer of a semiconductor chip the conduction state of heat is different in the proximity of the fault, so that a temperature gradient is generated in the proximity of the fault, thus generating an electromotive force therein, which can be detected as a current.

Figure 14:
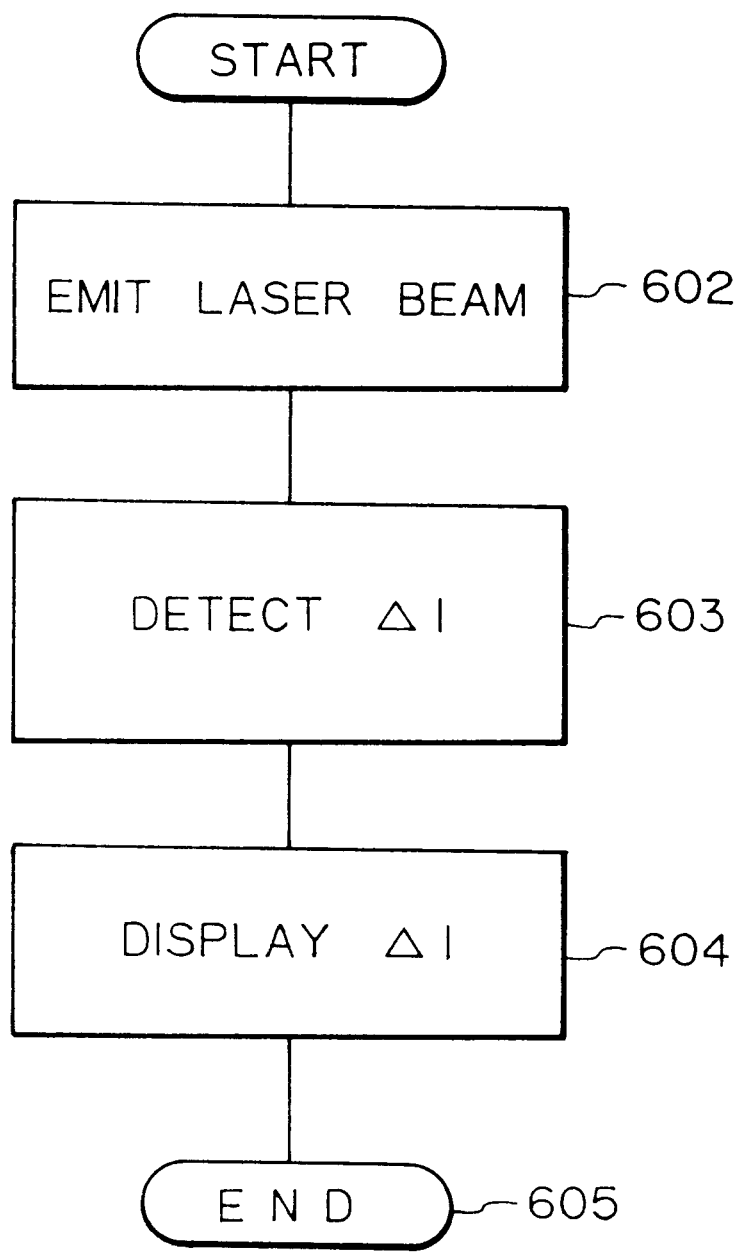
FIGS. 14 and 15 are flowcharts for showing the operation of the system control and signal processing unit of FIG. 12.
Figure 15:
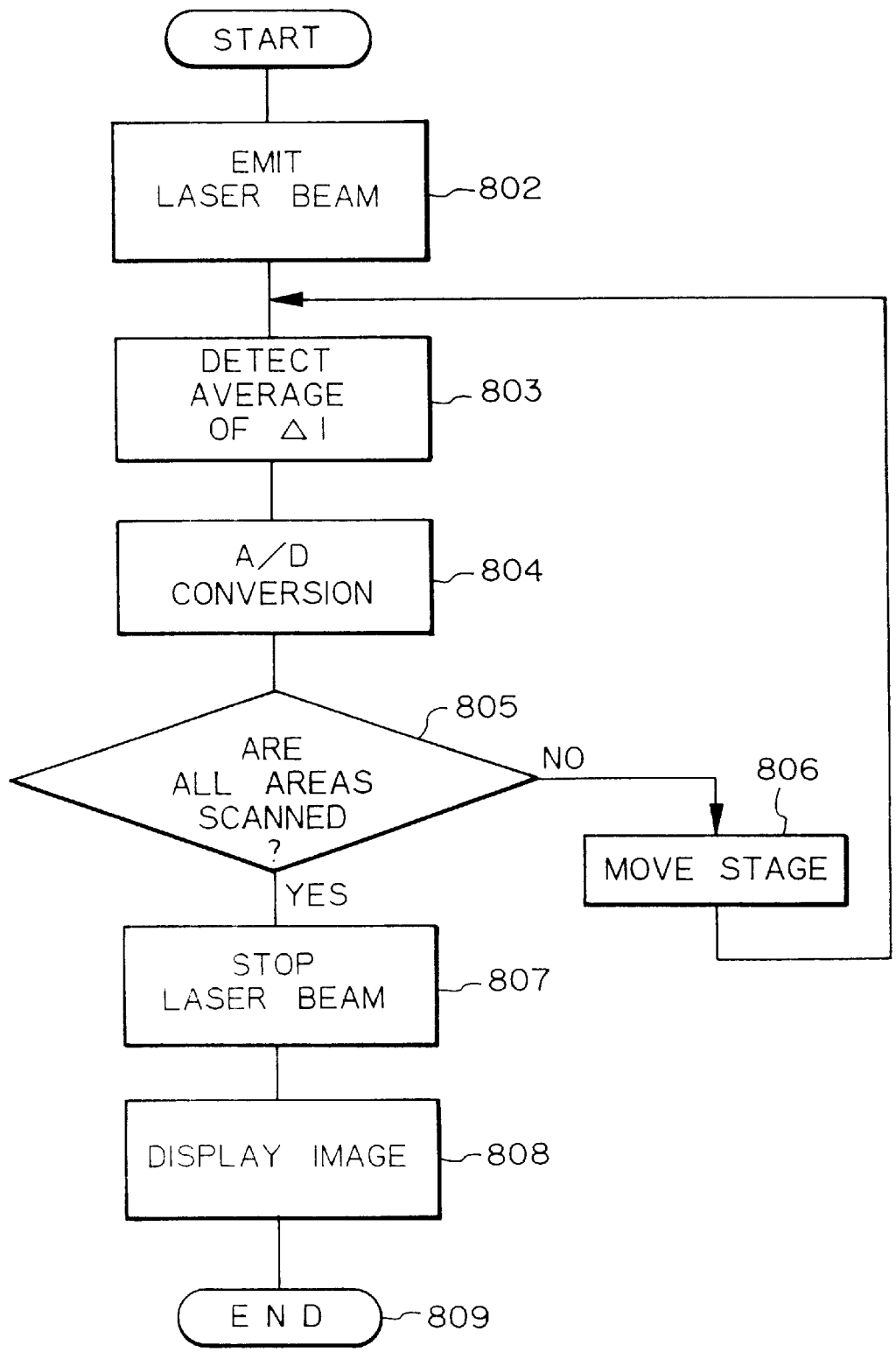

The operation of the system control and signal processing unit 8 of FIG. 12 is as shown in FIGS. 14 and 15, which correspond to FIGS. 6 and 8 respectively. In FIGS. 14 and 15, steps 601 and 801 of FIGS. 6 and 8 are not provided, since application of a constant voltage is unnecessary.

In the second embodiment, note that it is impossible to obtain a current image and a current-to-time diagram, only a defect image can be obtained. However, since the application of a constant voltage is unnecessary, the possibility of obtaining such a defect image is high.

Figure 16:
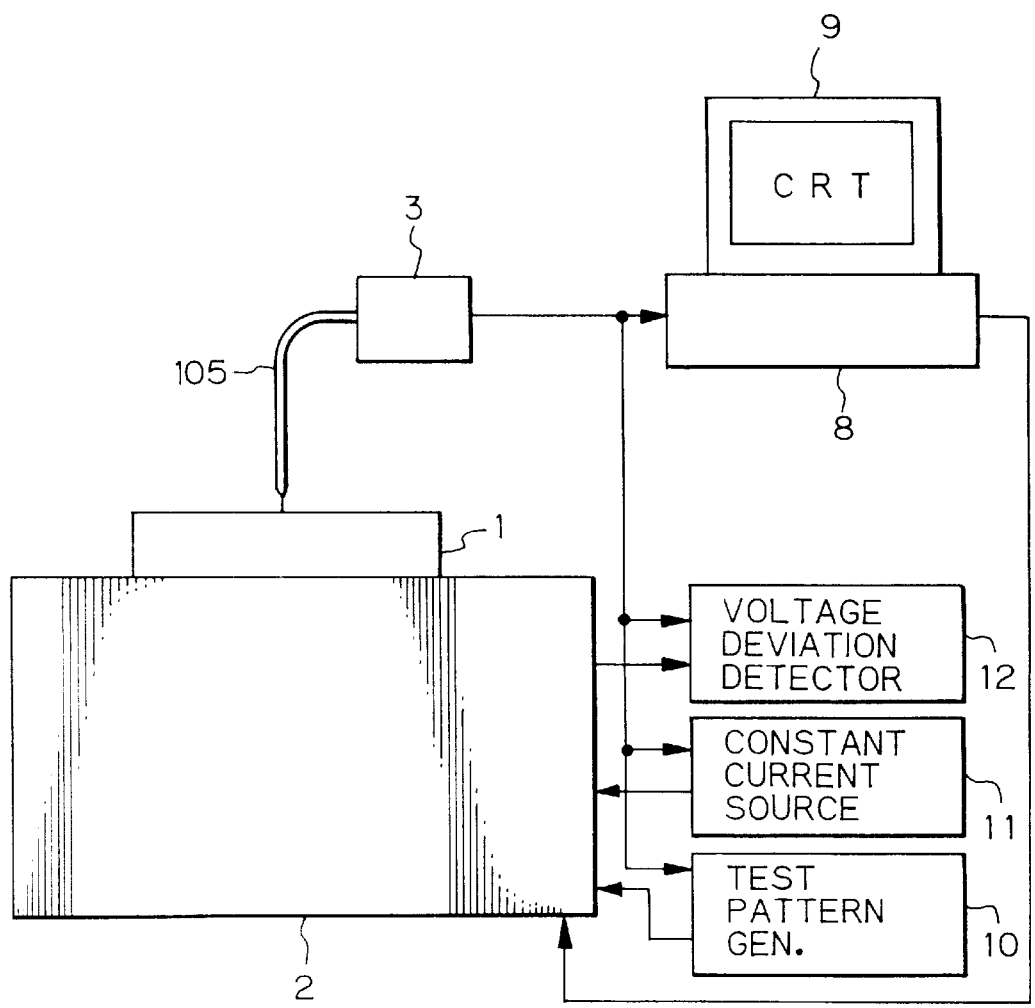
FIG. 16 is a diagram illustrating a third embodiment of the semiconductor device evaluation system according to the present invention.

In FIG. 16, which illustrates a third embodiment of the present invention, a constant current source 11 and a voltage deviation detector 12 are provided instead of the constant voltage source 6 and the current deviation detector 7, respectively, of FIG. 4.

Figure 17:
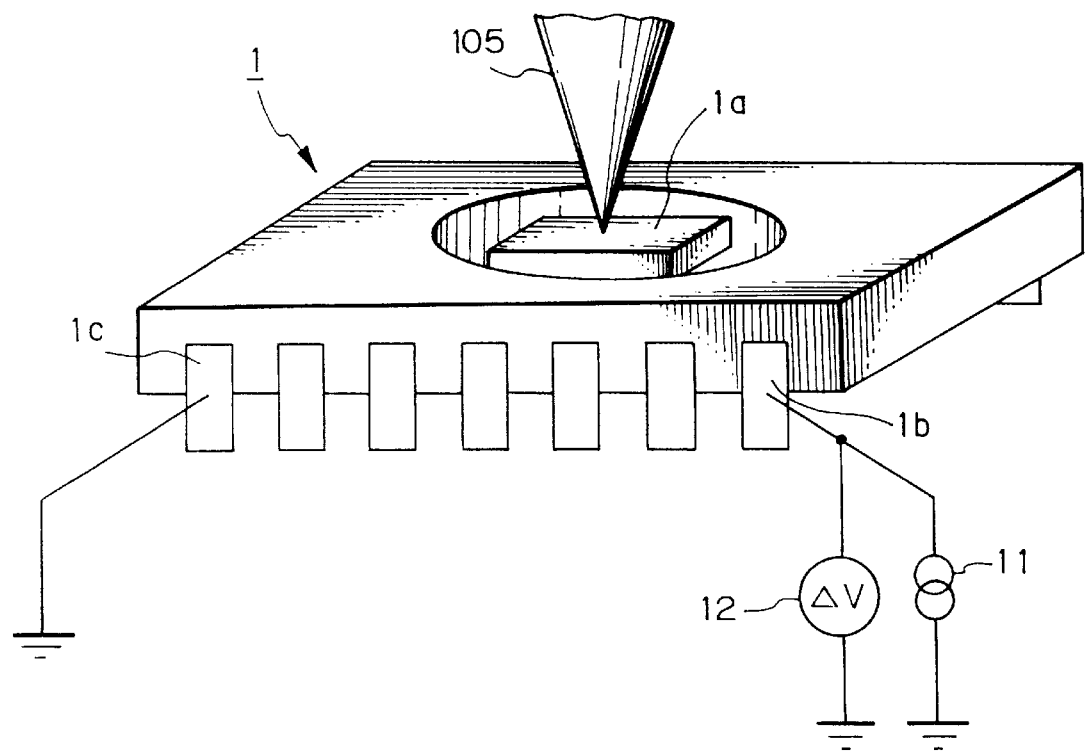
FIG. 17 is partly enlarged diagram of the system of FIG. 16.

In FIG. 17, the semiconductor device 1 of FIG. 16 is enlarged. The power supply terminal 1b of the semiconductor device 1 is connected to the constant current source 11 and the voltage deviation detector 12. Further, the ground terminal 1c of the semiconductor device 1 is grounded. In this case, since a voltage between the power supply terminal 1b and the ground terminal 1c is most important, the voltage deviation detector 12 can operate effectively. However, the voltage deviation detector 12 can be connected to another terminal such as another power supply terminal or a signal terminal.

In FIG. 17, the voltage deviation ΔV (see the formula (2)) can be detected by the voltage deviation detector 12 in accordance with the OBIRCH-BIV method.

A first example of operation of the system control and signal processing unit 8 of FIG. 16 is explained next with reference to FIG. 18.

First, at step 1801, the unit 8 operates the constant current source 11, so that a constant current is supplied to the power supply terminal 1b of FIG. 17.

Next, at step 1802, the unit 8 operates the laser beam generating unit 3, so that a laser beam is emitted into the optical fiber 105. As a result, an area of the semiconductor chip 1a, i.e., an interconnect layer thereof is heated, so that its resistance is increased.

Next, at step 1803, the unit 8 operates the voltage deviation detector 12, so that the voltage deviation ΔV caused by the increase of resistance is detected.

Next, at step 1804, the voltage deviation ΔV is displayed on the display unit 9.

Figure 18:
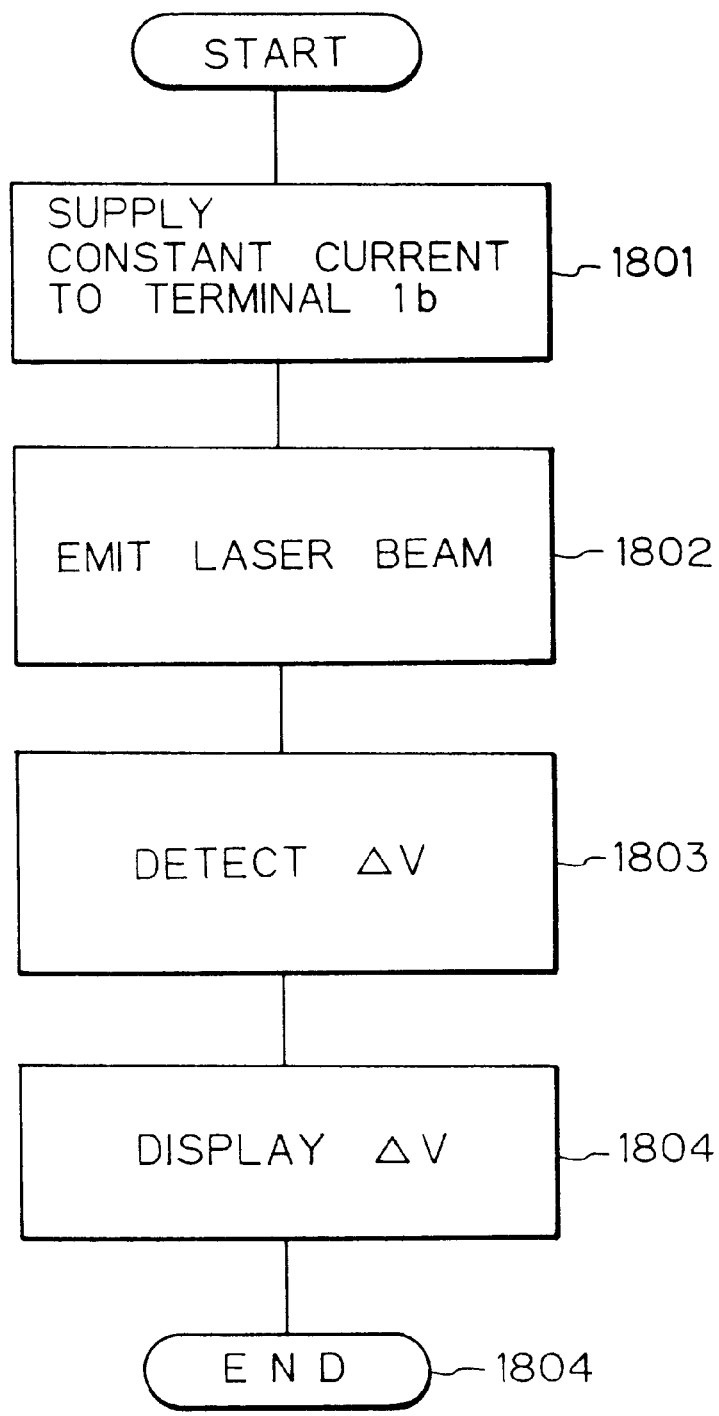
FIGS. 18, 19, 20, 21, 22A, 22B and 23 are flowcharts for showing the operation of the system control and signal processing unit of FIG. 16.

Finally, the routine of FIG. 18 is completed by step 605.

Figure 19:
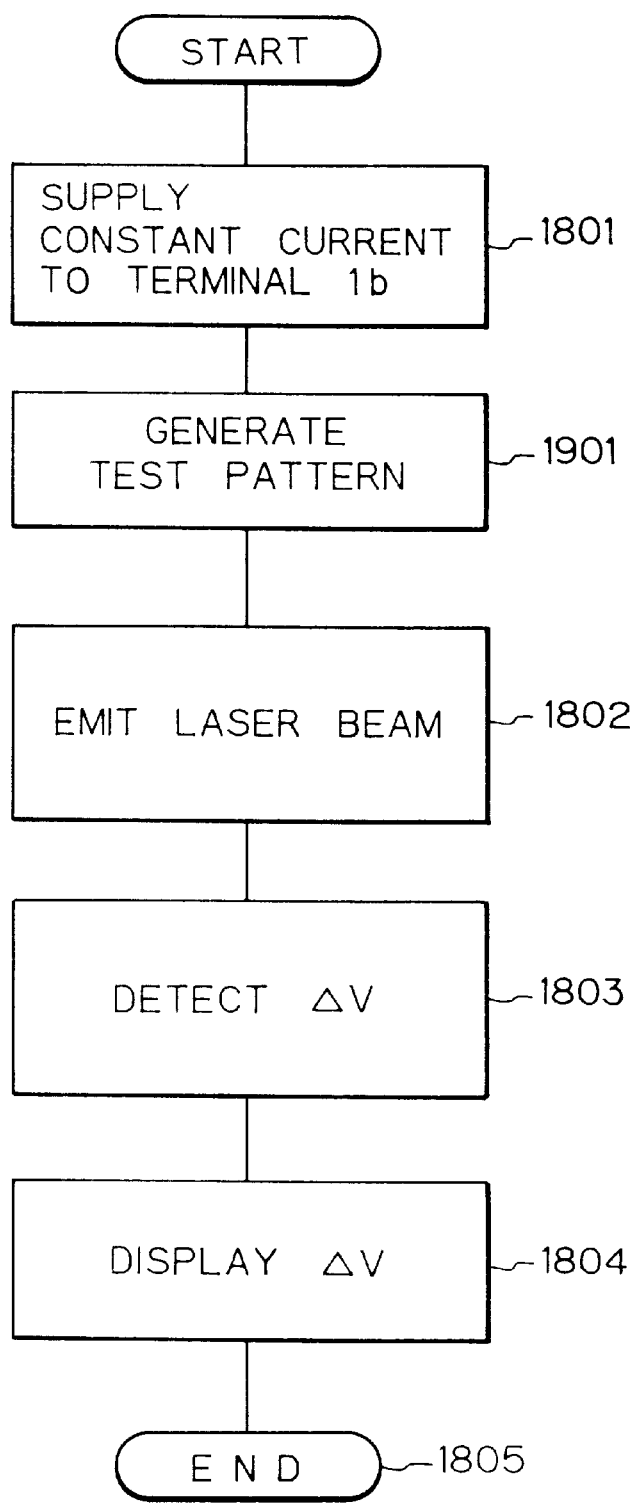

In FIG. 19, which is a modification of the flowchart of FIG. 18, a step 1901 is added to the steps of FIG. 18. That is, at step 1901, the unit 8 operates the test pattern generator 10, so that signals of a test pattern are supplied to terminals other than the terminals 1b and 1c. As a result, at step 1804, the voltage deviation ΔV corresponding to a special state defined by the test pattern can be detected by the voltage deviation detector 7.

A second example of operation of the system control and signal processing unit 8 of FIG. 16 is explained next with reference to FIG. 20.

First, at step 2001, the unit 8 operates the constant current source 11, so that a constant current is supplied to the power supply terminal 1b of FIG. 16.

Next, at step 2002, the unit 8 operates the laser beam generating unit 3, so that a laser beam is emitted into the optical fiber 105. As a result, an area of the semiconductor chip 1a, i.e., a interconnect layer thereof is heated, so that its resistance is increased.

Next, at step 2003, the unit 8 operates the voltage deviation detector 12, so that the voltage deviation ΔV caused by the increase of resistance is detected. In this case, the unit 8 calculates an average of the detected voltage deviation ΔV for a definite duration such as 2 μsec.

Next, at step 2004, the A/D converter of the unit 8 performs an A/D conversion upon the detected average voltage deviation ΔV, and stores an obtained digital value into a corresponding location of a memory of the unit 8.

Next, at step 2005, it is determined whether or not all required areas of the semiconductor chip 1a have been scanned with the laser beam. As a result, if all the required areas have not been scanned, the control proceeds to step 2006. Otherwise, the control proceeds to step 2007.

At step 2006, the unit 8 moves the stage 2, so that the laser beam is moved to the next point of the semiconductor chip 1a. Then, the control at steps 2003, 2004 and 2005 is repeated.

At step 2007, the unit 8 stops the operation of the laser beam generating unit 3.

Next, at step 2008, the unit 8 displays the digital values stored in the memory on the display unit 9, thus obtaining a defect image or a current image.

Figure 20:
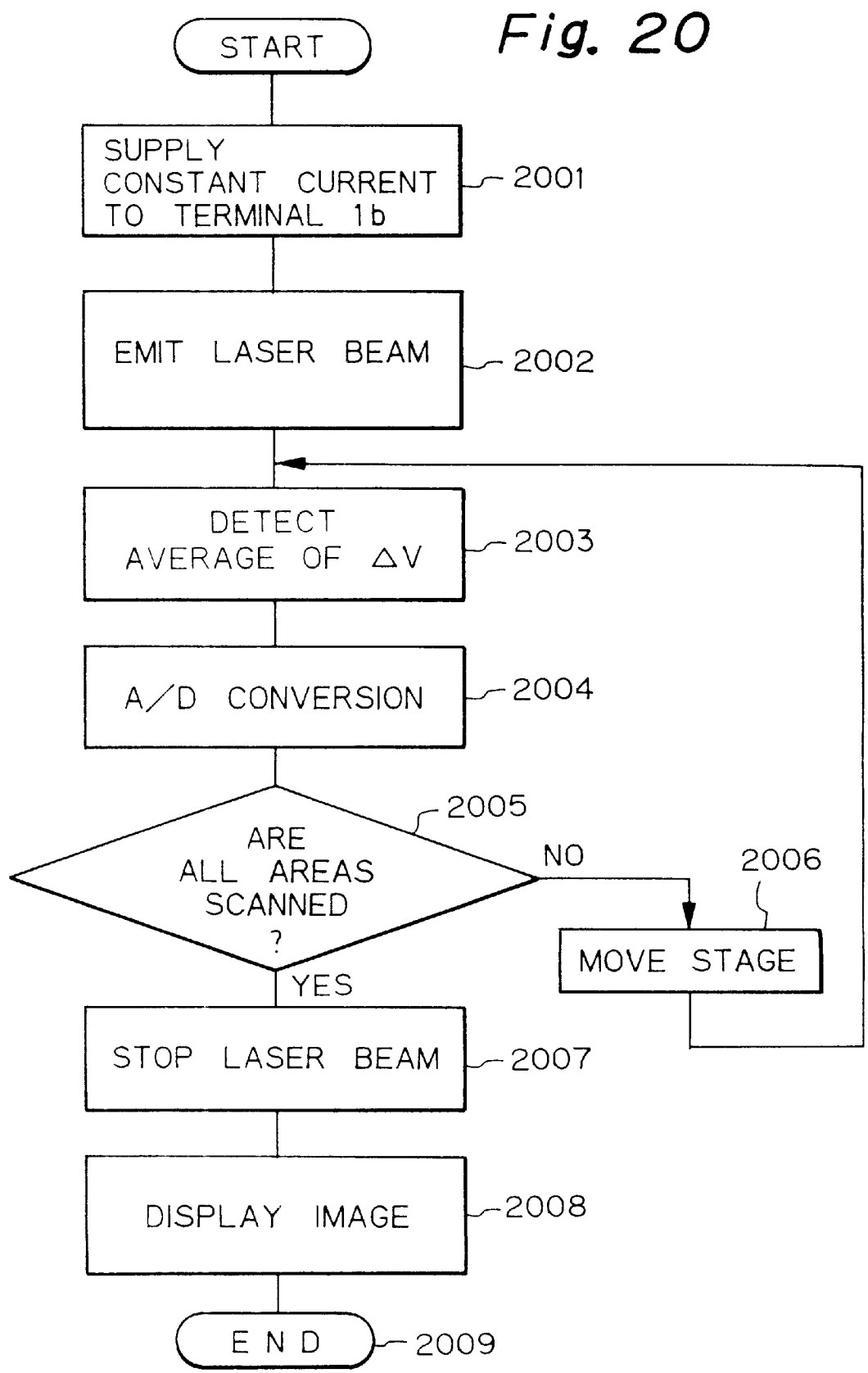

Finally, the routine of FIG. 20 is completed by step 2009.

Note that, if the number of the scanning steps of the required areas is 512×512, one defect image and/or current image can be obtained for every about 0.5 sec (=512×512×2 μsec).

Figure 21:
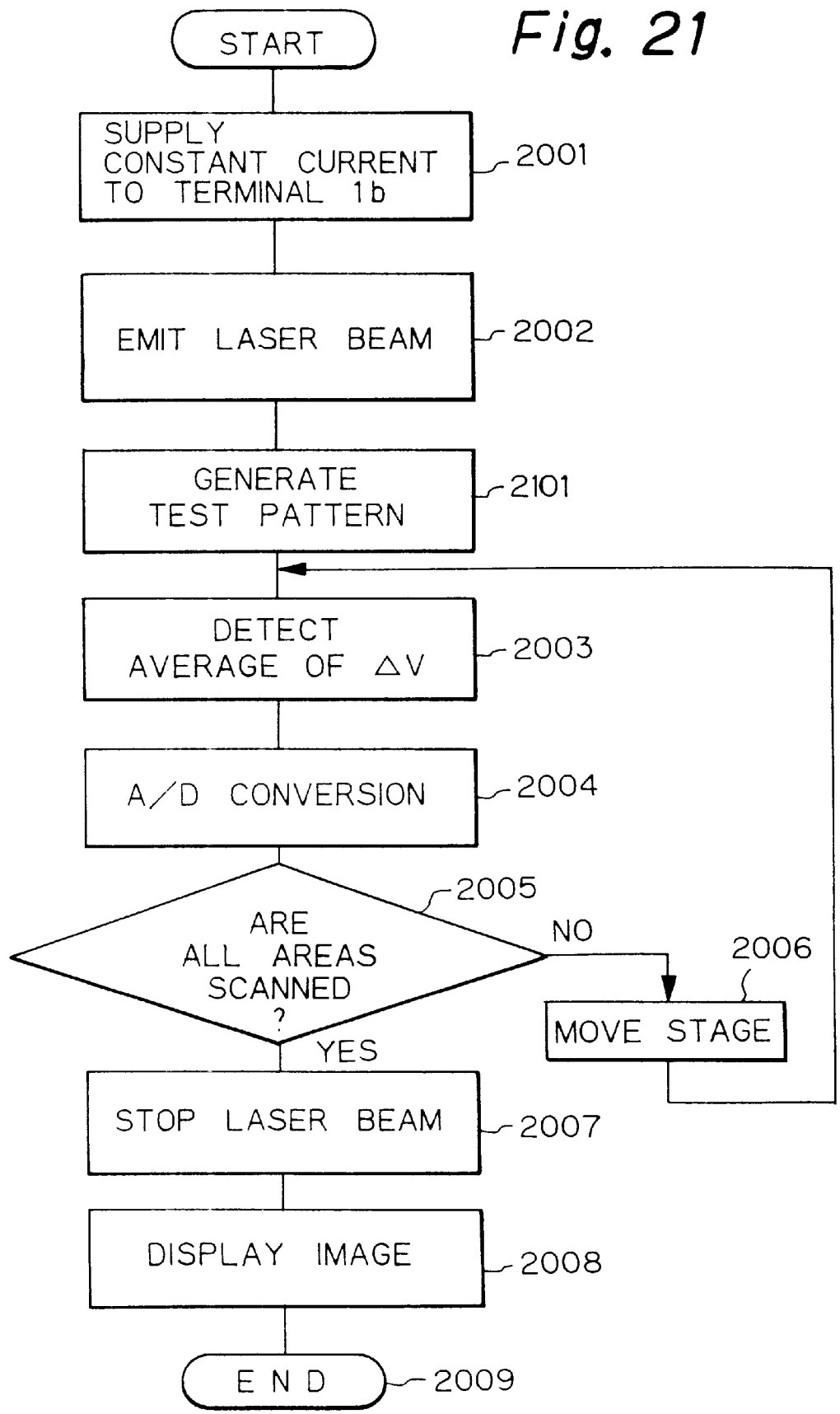

In FIG. 21, which is a modification of the flowchart of FIG. 20, a step 2101 is added to the steps of FIG. 20. That is, at step 2101, the unit 8 operates the test pattern generator 10, so that signals of a test pattern are supplied to terminals other than the terminals 1b and 1c. As a result, at step 2008, a defect image and/or voltage image corresponding to special states defined by the test pattern can be displayed on the display unit 9.

A third example of operation of the system control and signal processing unit 8 of FIG. 16 is explained next with reference to FIG. 22A. For example, after a defect image and/or a current image is obtained by the flowchart of FIG. 20, if a voltage-to-time diagram of a specified area is required, the third operation is carried out.

First, at step 2201, the unit 8 operates the constant current source 11, so that a constant current is supplied to the power supply terminal 1b of FIG. 17.

Next, at step 2202, the unit 8 operates the laser beam generating unit 3, so that a laser beam is emitted into the optical fiber 105. In this case, the laser beam is pulse-shaped, that is, formed by pulses having a duration of 2 μsec and a duration of 1 μsec. As a result, a point of an area of the semiconductor chip 1a, i.e., an interconnect layer thereof is heated, so that its resistance is increased.

Next, at step 2203, the unit 8 operates the voltage deviation detector 12, so that the current deviation ΔV caused by the increase of resistance is detected. In this case, the unit 8 calculates an average of the detected voltage deviation ΔV for a definite duration such as the pulse duration of 1 μsec.

Next, at step 2204, the A/D converter of the unit 8 performs an A/D conversion upon the detected average voltage deviation ΔV, and stores an obtained digital value into a corresponding location of the memory of the unit 8. Note that if a sufficient S/N ratio cannot be obtained by one series of steps 1003 to 1005 and the detected current deviation ΔI has a period, the control at steps 1003 through 1005 is caused to synchronize with the period of the detected current deviation ΔI so that the detected current deviations ΔI care calculated and averaged, the S/N ratio can be improved, as shown in FIG. 22B.

Next, at step 2205, it is determined whether or not a predetermined duration has passed. As a result, when the predetermined duration has not passed yet, the control returns to step 2203. Otherwise, the control proceeds to step 2206.

At step 2206, the unit 8 stops the operation of the laser beam generating unit 3.

Next, at step 2207, the unit 8 displays the digital values stored in the memory on the display unit 9, so that the X axis shows time and the Y axis shows ΔV (proportional to I), thus obtaining a current-to-time diagram.

Figure 22A:
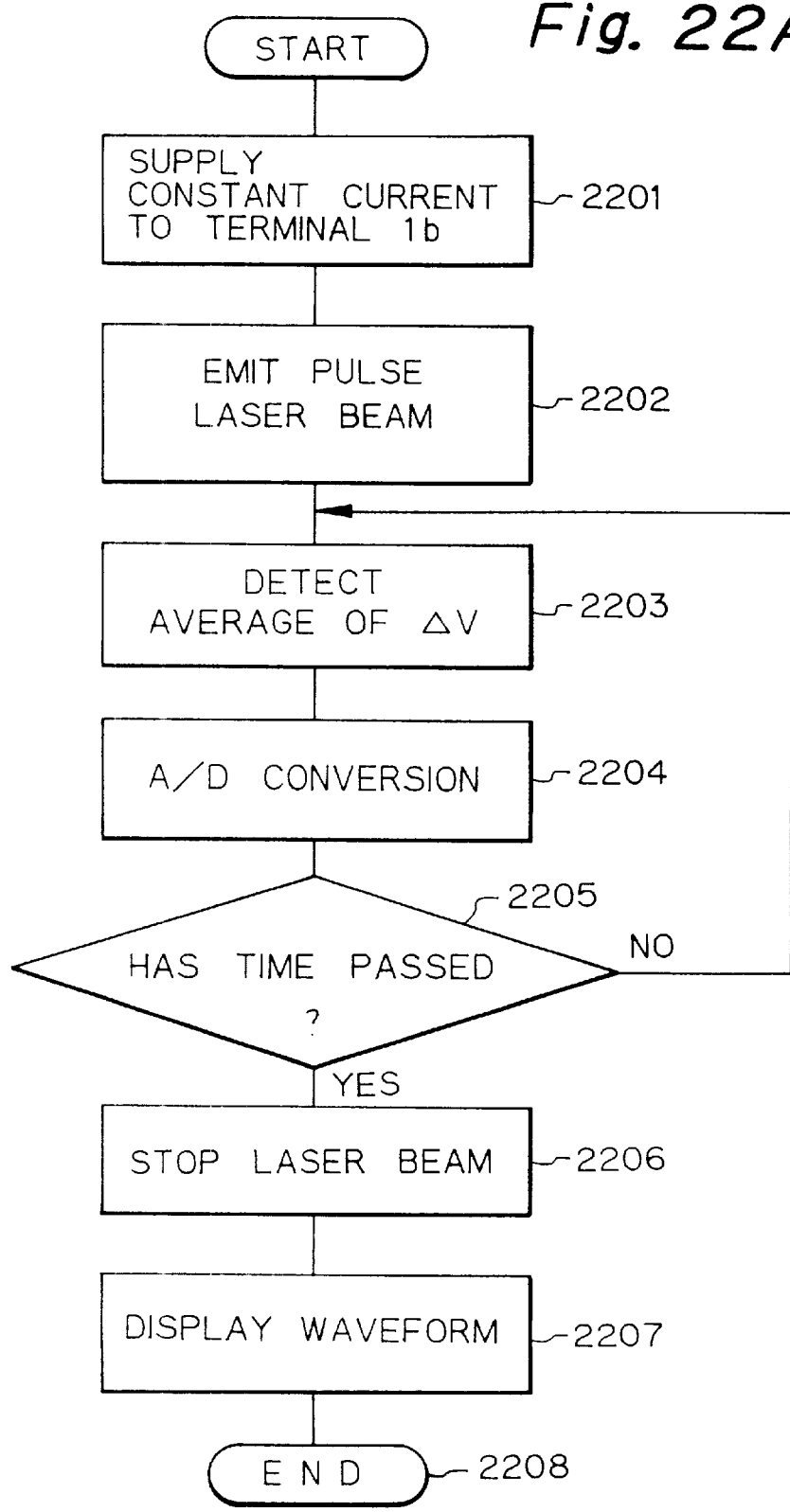
Figure 22B:
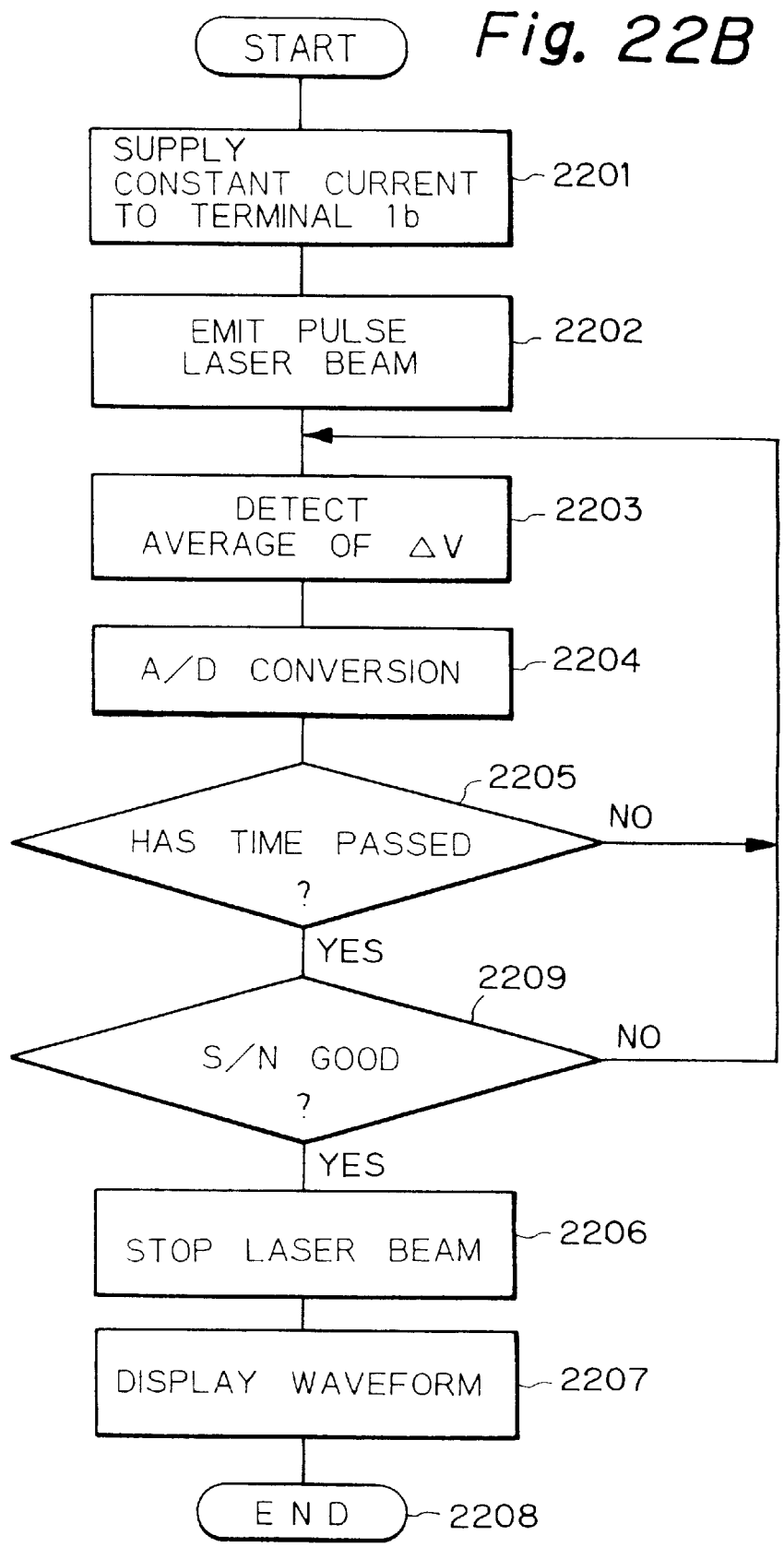

Finally, the routine of FIG. 22A is completed by step 2208.

Figure 23:
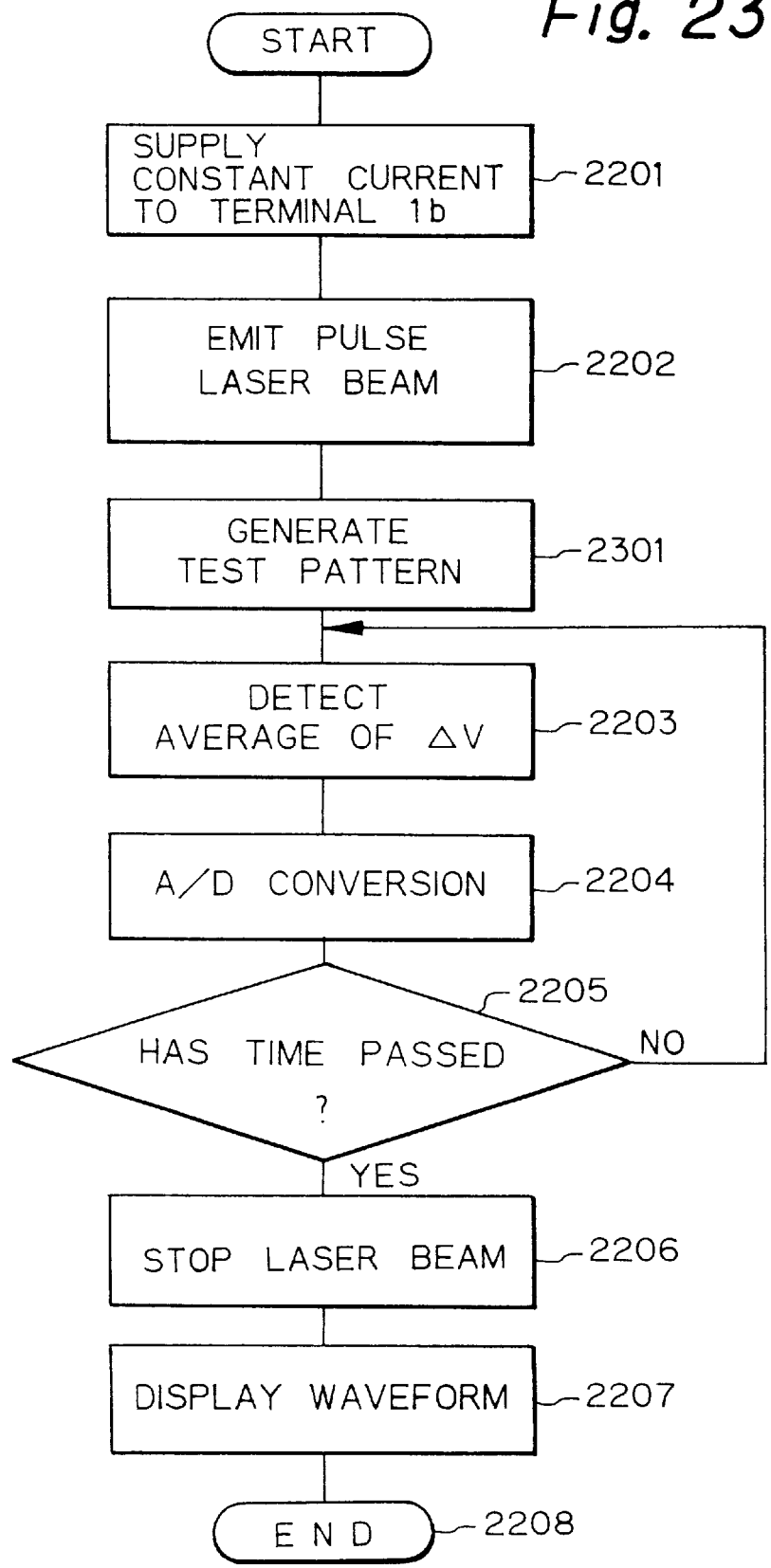

In FIG. 23, which is a modification of the flowchart of FIG. 22A, a step 2301 is added to the steps of FIG. 22A. That is, at step 2301, the unit 8 operates the test pattern generator 10, so that signals of a test pattern are supplied to terminals other than the terminals 1b and 1c. As a result, at step 2207, a voltage-to-time diagram corresponding to special states defined by the test pattern can be displayed on the display unit 9.

At step 2202 of FIGS. 22A and 23, if the pulse duration and duration of the laser beam is further reduced, a high time resolution can be obtained.

Figure 25A:
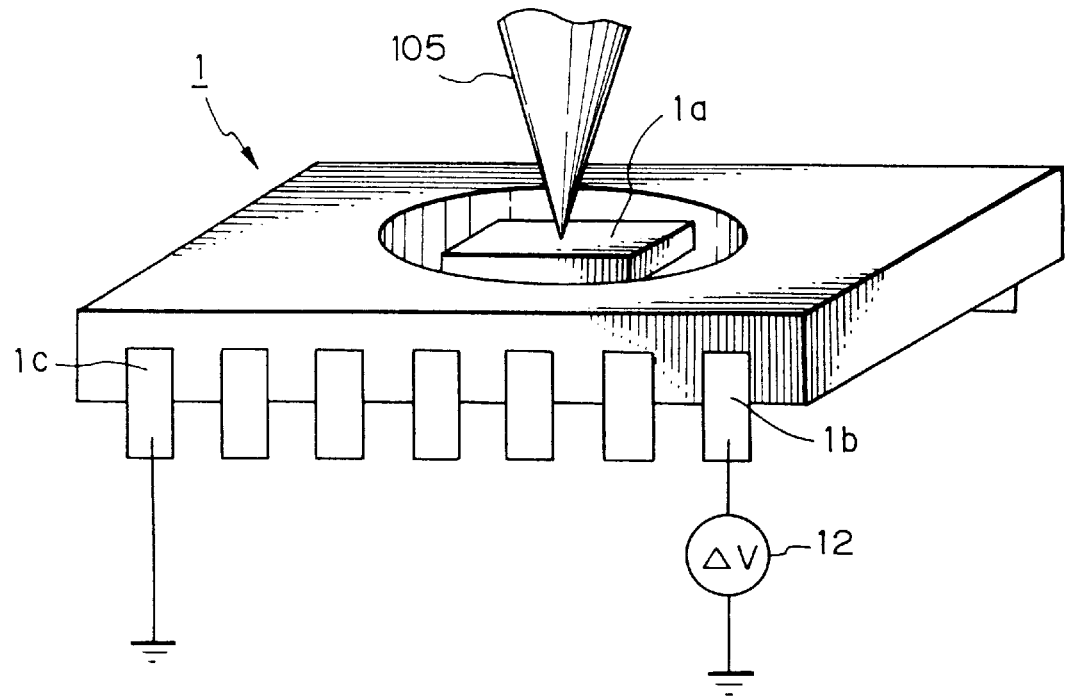
FIGS. 25A and 25B are partly enlarged disgrams of the system of FIG. 24.
Figure 25B:
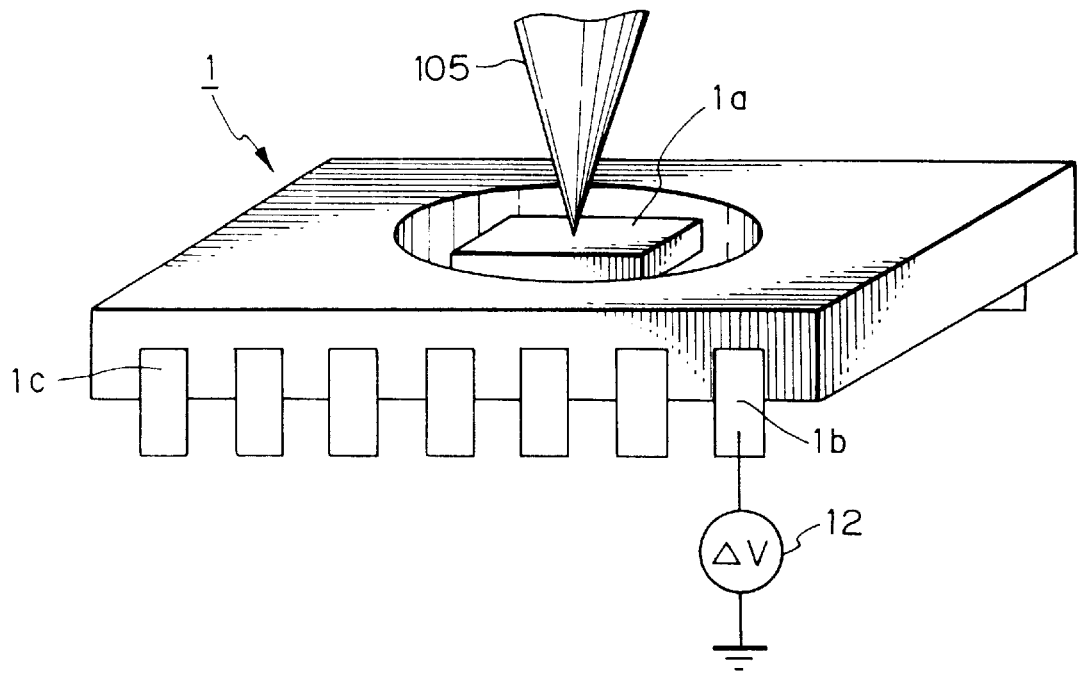

In FIG. 24, which illustrates a fourth embodiment of the present invention, the constant current source 11 and the test pattern generator 10 of FIG. 16 are not provided. In this case, as illustrated in FIG. 25A the ground terminal 1c is grounded. Or, as illustrated in FIG. 25B, the ground terminal 1c is opened. Thus, an OBIRCH-NBV method, where no bias current is supplied, is carried out. In this case, as stated above, if a fault exists in an interconnect layer of a semiconductor chip the conduction state of heat is different in the proximity of the fault, so that a temperature gradient is generated in the proximity of the fault, thus generating an electromotive force therein, which can be detected as a voltage.

Figure 26:
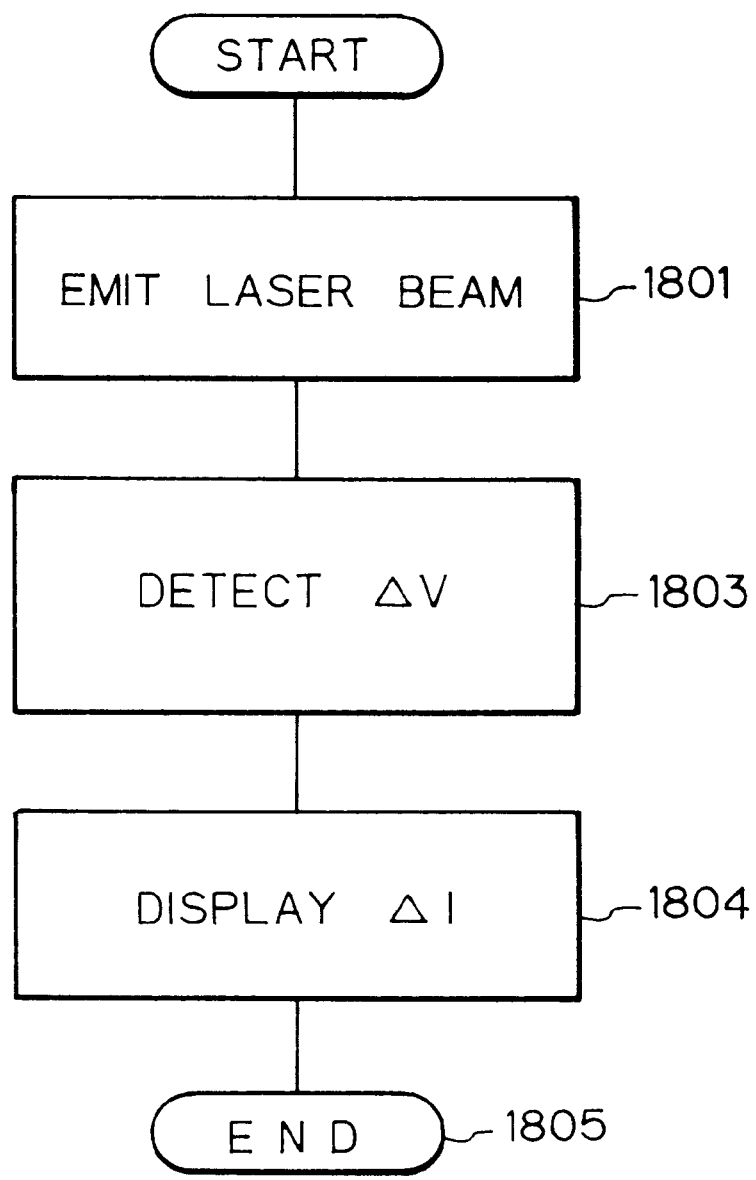
FIGS. 26 and 27 are flowcharts for showing the operation of the system control and signal processing unit of FIG. 24.
Figure 27:
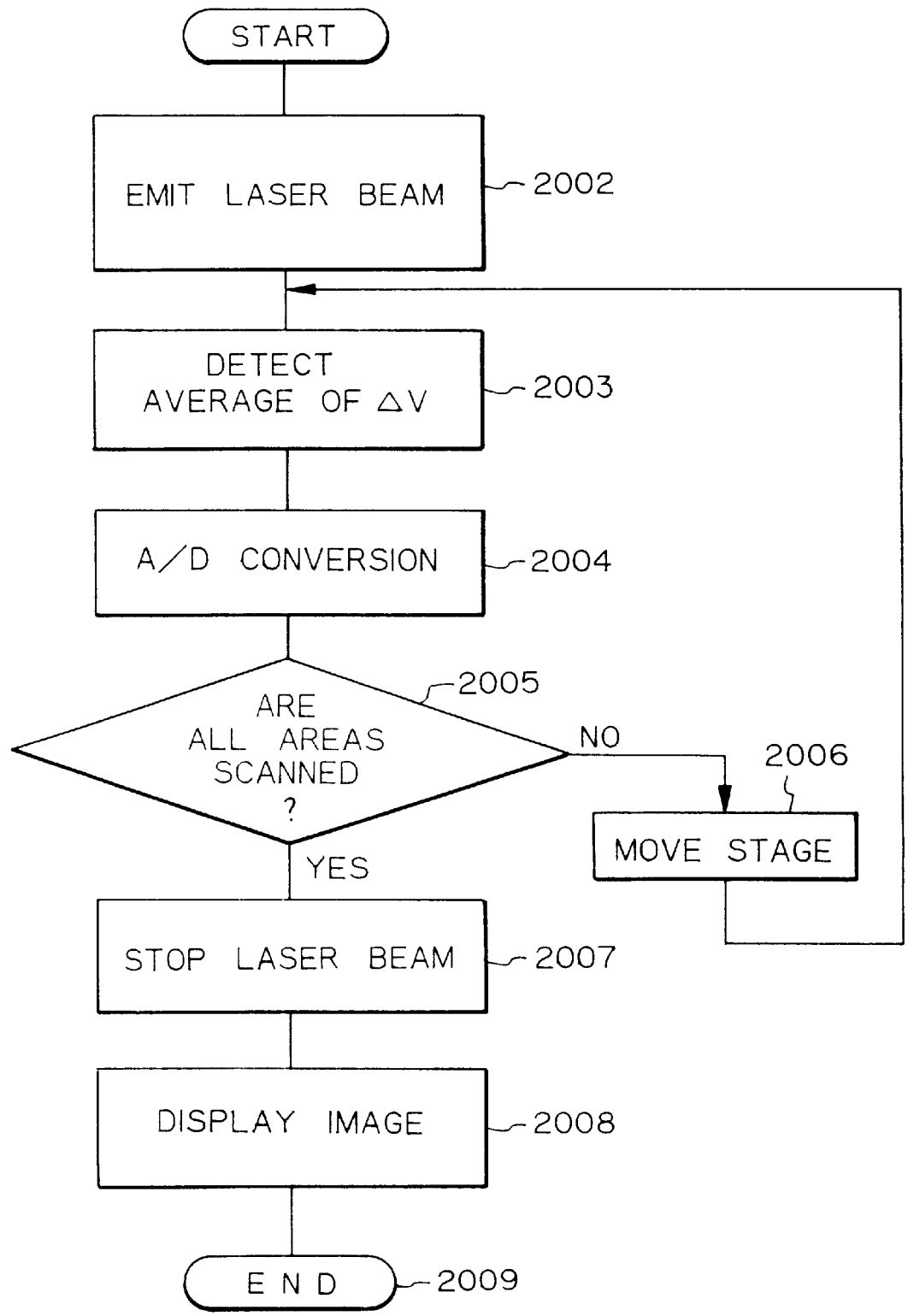

The operation of the system control and signal processing unit 8 of FIG. 24 is as shown in FIGS. 26 and 27, which correspond to FIGS. 18 and 20 respectively. In FIGS. 26 and 27, steps 1801 and 2001 of FIGS. 18 and 20 are not provided, since supplying of a current is unnecessary.

In the fourth embodiment, note that it is impossible to obtain a current image and a current-to-time diagram, only a defect image can be obtained. However, since the application of a constant current is unnecessary, the possibility of obtaining such a defect image is high.

The present invention can be applied to detection of a current path caused by a $I_{DDQ}$ failure in a CMOS integrated circuit. That is, if the CMOS integrated circuit has a physical defect therein, an abnormal quiescent $V_{DD}$ supply current $I_{DDQ}$ flows therethrough (see M. Sanada, "New Application of Laser Beam to Failure Analysis of LSI with Multi-Metal Layers", Microelectronics and Reliability, Vol. 33, No. 7, pp. 993–1009, 1993, and M. Sanade, "Evaluation and Detection of CMOS-LSI with Abnormal IDDQ", Microelectronics and Reliability Vol. 35, No. 3, pp. 619–629, 1995). In the OBIRCH method, since a sensivivity of $\mu$A is obtained, if an abnormal quiescent $V_{DD}$ supply current $V_{DDQ}$ of $\mu$A flows from the power supply terminal 1b to the ground terminal 1c of FIGS. 5, 13A, 13B, 17, 25A or 25B, this current $I_{DDQ}$ can be detected as a current path to form a current image. For example, if a chip of the CMOS integrated circuit is 10 mm×10 mm, the abnormal current path can be easily detected by monitoring at least 4 visual fields of 5 mm×5 mm.

Also, an obtained current image of a semiconductor device is compared with a current image of a known good device (KGD) thus determining whether the semiconductor device is normal or defective. Note that, in the prior art, this comparison was carried out by irradiating a semiconductor device and a KGD with electron beams using an electron beam tester; however, in this case, the electron beam tester is in a vacuum chamber, which makes the operation complex. On the other hand, in the present invention, since such a vacuum chamber is unnecessary, the operation is very easy.

As explained hereinabove, according to the present invention, since use is made of a laser beam introduced into a tip portion of an optical fiber, generation of electron-hole pairs can be suppressed, and an evaluation can be non-destructively carried out.

I claim:

1. A system for evaluating a semiconductor device, comprising:
    a laser beam generating unit for generating a laser beam;
    an optical fiber, coupled to said laser beam generating unit, for receiving said laser beam to heat an area of said semiconductor device; and
    a current deviation detector, connected to a first terminal of said semiconductor device, for detecting a current deviation at said first terminal caused by heating the area of said semiconductor device.

2. The system as set forth in claim 1, wherein said optical fiber is spire-shaped.

3. The system as set forth in claim 2, wherein a tip portion of said optical fiber is in contact with the area of said semiconductor device, so that heat within the tip portion of said optical fiber is transferred by conduction of heat to the area of said semiconductor device.

4. The system as set forth in claim 3, wherein said optical fiber except for the tip portion thereof is coated by metal.

5. The system as set forth in claim 3, wherein said optical fiber including the tip portion thereof is coated by metal.

6. The system as set forth in claim 2, wherein a tip portion of said optical fiber is not in contact with the area of said semiconductor device, so that heat within the tip portion of said optical fiber is transferred by thermal radiation to the area of said semiconductor device.

7. The system as set forth in claim 6, wherein said optical fiber except for the tip portion thereof is coated by metal.

8. The system as set forth in claim 6, wherein said optical fiber including the tip portion thereof is coated by metal.

9. The system as set forth in claim 2, wherein said optical fiber except for a tip portion thereof is coated by metal,
    a size of said tip portion being less than a wavelength of said laser beam,
    the tip portion of said optical fiber being in close proximity to the area of said semiconductor device, so that near-field light leaks from the tip portion of said semiconductor to the area of said semiconductor device.

10. The system as set forth in claim 2, wherein said optical beam is a near infrared radiation,
    said optical fiber except for a tip portion thereof being coated by metal,
    a size of said tip portion larger than a wavelength of said laser beam,
    the tip portion of said optical fiber being not in contact with the area of said semiconductor device, so that far-field light leaks from the tip portion of said semiconductor to the area of said semiconductor device.

11. The system as set forth in claim 1, further comprising a constant voltage source connected to a second terminal of said semiconductor device.

12. The system as set forth in claim 1, wherein said first terminal is a ground terminal,
    a power supply terminal of said semiconductor device being grounded.

13. The system as set forth in claim 1, wherein said first terminal is a ground terminal,
    a power supply terminal of said semiconductor device being opened.

14. The system as set forth in claim 1, further comprising:
    a control unit for scanning said laser beam with respect to said semiconductor device; and
    a display unit for displaying said current deviation.

15. A system for evaluating a semiconductor device, comprising:
    a laser beam generating unit for generating a laser beam;
    an optical fiber, coupled to said laser beam generating unit, for receiving said laser beam to heat an area of said semiconductor device; and
    a voltage deviation detector, connected to a first terminal of said semiconductor device, for detecting a voltage deviation at said first terminal caused by heating the area of said semiconductor device.

16. The system as set forth in claim 15, wherein said optical fiber is spire-shaped.

17. The system as set forth in claim 16, wherein a tip portion of said optical fiber is in contact with the area of said semiconductor device, so that heat within the tip portion of said optical fiber is transferred by conduction of heat to the area of said semiconductor device.

18. The system as set forth in claim 17, wherein said optical fiber except for the tip portion thereof is coated by metal.

19. The system as set forth in claim 17, wherein said optical fiber including the tip portion thereof is coated by metal.

20. The system as set forth in claim 16, wherein a tip portion of said optical fiber is not in contact with the area of said semiconductor device, so that heat within the tip portion of said optical fiber is transferred by thermal radiation to the area of said semiconductor device.

21. The system as set forth in claim 20, wherein said optical fiber except for the tip portion thereof is coated by metal.

22. The system as set forth in claim 20, wherein said optical fiber including the tip portion thereof is coated by metal.

23. The system as set forth in claim 16, wherein said optical fiber except for a tip portion thereof is coated by metal.

a size of said tip portion being less than a wavelength of said laser beam, the tip portion of said optical fiber being in close proximity to the area of said semiconductor device, so that near-field light leaks from the tip portion of said semiconductor to the area of said semiconductor device.

24. The system as set forth in claim 16, wherein said optical beam is a near infrared radiation, a size of said tip portion being less than a wavelength of said laser beam, said optical fiber except for a tip portion thereof being coated by metal, a size of said tip portion being less than a wavelength of said laser beam, the tip portion of said optical fiber being not in contact with the area of said semiconductor device, so that far-field light leaks from the tip portion of said semiconductor to the area of said semiconductor device.

25. The system as set forth in claim 15, further comprising a constant current source connected to said first terminal of said semiconductor device, a second terminal of said semiconductor device being grounded.

26. The system as set forth in claim 15, wherein said first terminal is a power supply terminal, a ground terminal of said semiconductor device being grounded.

27. The system as set forth in claim 15, wherein said first terminal is a power supply terminal, a ground terminal of said semiconductor device being opened.

28. The system as set forth in claim 15, further comprising:

a control unit for scanning said laser beam with respect to said semiconductor device; and a display unit for displaying said current deviation.

29. A method for evaluating a semiconductor device, comprising the steps of:

moving a tip portion of a spire-shaped optical fiber to an area of said semiconductor device;

emitting a laser beam into said optical fiber to heat the area of said semiconductor device; and detecting a current deviation at a first terminal of said semiconductor device caused by heating the area of said semiconductor device.

30. The method as set forth in claim 29, wherein said optical fiber moving step comprises a step of causing the tip portion of said optical fiber to be in contact with the area of said semiconductor device, so that heat within the tip portion of said optical fiber is transferred by conduction of heat to the area of said semiconductor device.

31. The method as set forth in claim 29, wherein said optical fiber moving step comprises a step of causing the tip portion of said optical fiber to be not in contact with the area of said semiconductor device, so that heat within the tip portion of said optical fiber is transferred by thermal radiation to the area of said semiconductor device.

32. The system as set forth in claim 29, wherein said optical fiber moving step comprises a step of causing the tip portion of said optical fiber to be in close proximity to the area of said semiconductor device, so that light leaks from the tip portion of said semiconductor to the area of said semiconductor device.

33. The system as set forth in claim 29, wherein said optical beam is a near infrared radiation, said optical fiber moving step comprising causing the tip portion of said optical fiber to be not in contact with the area of said semiconductor device, so that light leaks from the tip portion of said semiconductor to the area of said semiconductor device.

34. The method as set forth in claim 29, further comprising a step of applying a constant voltage to a second terminal of said semiconductor device.

35. The method as set forth in claim 29, further comprising a step of causing a second terminal of said semiconductor device to be grounded.

36. The method as set forth in claim 29, further comprising a step of causing a second terminal of said semiconductor device to be opened.

37. The method as set forth in claim 29, further comprising a step of supplying test pattern signals to terminals of said semiconductor device.

38. The method as set forth in claim 29, further comprising the steps of:

scanning the tip portion of said optical fiber with respect to said semiconductor device; and displaying an image of said current deviation during said scanning step and/or after said scanning step completes its operation.

39. The method as set forth in claim 29, further comprising the steps of:

stationing the tip portion of said optical fiber with respect to said semiconductor device for a predetermined duration; and displaying said current deviation as a current-to-time diagram during said scanning step and/or after said stationing step completes its operation.

40. A method for evaluating a semiconductor device, comprising the steps of:

moving a tip portion of a spire-shaped optical fiber to an area of said semiconductor device;

emitting a laser beam into said optical fiber to heat the area of said semiconductor device; and detecting a voltage deviation at a first terminal of said semiconductor device caused by heating the area of said semiconductor device.

41. The method as set forth in claim 40, wherein said optical fiber moving step comprises a step of causing the tip portion of said optical fiber to be in contact with the area of said semiconductor device, so that heat within the tip portion of said optical fiber is transferred by conduction of heat to the area of said semiconductor device.

42. The method as set forth in claim 40, wherein said optical fiber moving step comprises a step of causing the tip portion of said optical fiber to be not in contact with the area of said semiconductor device, so that heat within the tip portion of said optical fiber is transferred by thermal radiation to the area of said semiconductor device.

43. The method a set forth in claim 40, wherein said optical fiber moving step comprises a step of causing the tip portion of said optical fiber to be in close proximity to the area of said semiconductor device, so that light leaks from the tip portion of said semiconductor to the area of said semiconductor device.

44. The method as set forth in claim 40, wherein said optical beam is a near infrared radiation, said optical fiber moving step comprising causing the tip portion of said optical fiber to be not in contact with the area of said semiconductor device, so that light leaks from the tip portion of said semiconductor to the area of said semiconductor device.

45. The method as set forth in claim 40, further comprising the steps of:

supplying a constant current to the first terminal of said semiconductor device; and causing a second terminal of said semiconductor device to be grounded.

46. The method as set forth in claim 40, further comprising a step of causing a second terminal of said semiconductor device to be grounded.

47. The method as set forth in claim 40, further comprising a step of causing a second terminal of said semiconductor device to be opened.

48. The method as set forth in claim 40, further comprising a step of supplying test pattern signals to terminals of said semiconductor device.

49. The method as set forth in claim 40, further comprising the steps of:

scanning the tip portion of said optical fiber with respect to said semiconductor device; and displaying an image of said voltage deviation during said scanning step and/or after said scanning step completes its operation.

50. The method as set forth in claim 40, further comprising the steps of:

stationing the tip portion of said optical fiber with respect to said semiconductor device for a predetermined duration; and displaying said voltage deviation as a current-to-time diagram during said scanning step and/or after said stationing step completes its operation.

51. A system for evaluating a semiconductor device, comprising:

a laser beam generating unit for generating a laser beam;

an optical fiber having an aperture at a tip end, coupled to said laser beam generating unit, for receiving said laser beam to heat an area of said semiconductor device under said aperture; and an electrical deviation detector, connected a first terminal of said semiconductor device, for detecting an electrical deviation at said first terminal caused by heating the area of said semiconductor device.

* * * * *